United States Patent
Aoki

(10) Patent No.: US 9,807,330 B2
(45) Date of Patent: Oct. 31, 2017

(54) SOLID-STATE IMAGING DEVICE AND IMAGING APPARATUS

(71) Applicant: Olympus Corporation, Hachioji-shi, Tokyo (JP)

(72) Inventor: Jun Aoki, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 25 days.

(21) Appl. No.: 15/130,222

(22) Filed: Apr. 15, 2016

(65) Prior Publication Data

US 2016/0234452 A1 Aug. 11, 2016

Related U.S. Application Data

(63) Continuation of application No. PCT/JP2014/076572, filed on Oct. 3, 2014.

(30) Foreign Application Priority Data

Nov. 8, 2013 (JP) ................................ 2013-232228

(51) Int. Cl.
*H04N 5/374* (2011.01)
*H04N 5/3745* (2011.01)
(Continued)

(52) U.S. Cl.
CPC ... *H04N 5/37457* (2013.01); *H01L 27/14603* (2013.01); *H01L 27/14621* (2013.01);
(Continued)

(58) Field of Classification Search
CPC ......... H01L 27/14603; H01L 27/14621; H01L 27/14634; H01L 27/14641;
(Continued)

(56) References Cited

U.S. PATENT DOCUMENTS

| 8,710,419 | B2* | 4/2014 | Bogaerts | ............. | H01L 27/1461 250/208.1 |
| 2003/0048363 | A1* | 3/2003 | Watanabe | ............. | H04N 5/235 348/222.1 |

(Continued)

FOREIGN PATENT DOCUMENTS

| JP | 2003-158660 A | 5/2003 |
| JP | 2010-34890 A | 2/2010 |

(Continued)

OTHER PUBLICATIONS

International Search Report dated Dec. 16, 2014, issued in counterpart International Application No. PCT/JP2014/076572 (2 pages).

*Primary Examiner* — Amy Hsu
(74) *Attorney, Agent, or Firm* — Westerman, Hattori, Daniels & Adrian, LLP

(57) ABSTRACT

A solid-state imaging device includes a plurality of first photoelectric conversion elements, a plurality of second photoelectric conversion elements different from the plurality of first photoelectric conversion elements, a plurality of storage units, and a control unit. The plurality of storage units store signal charges output only from the plurality of first photoelectric conversion elements. The control unit controls operations of a first mode of outputting first signals based on signal charges output only from the plurality of first photoelectric conversion elements and stored in the plurality of storage units and a second mode of outputting second signals based on signal charges output from the plurality of first photoelectric conversion elements and the plurality of second photoelectric conversion elements without passing through the plurality of storage units.

14 Claims, 14 Drawing Sheets

(51) Int. Cl.
*H04N 5/353* (2011.01)
*H04N 9/04* (2006.01)
*H01L 27/146* (2006.01)

(52) U.S. Cl.
CPC .. *H01L 27/14634* (2013.01); *H01L 27/14641* (2013.01); *H01L 27/14645* (2013.01); *H04N 5/3532* (2013.01); *H04N 5/3745* (2013.01); *H04N 9/045* (2013.01)

(58) Field of Classification Search
CPC ............ H01L 27/12645; H04N 5/3532; H04N 5/3745; H04N 5/37457; H04N 9/045
See application file for complete search history.

(56) References Cited

U.S. PATENT DOCUMENTS

| | | | | |
|---|---|---|---|---|
| 2009/0152664 | A1* | 6/2009 | Klem | H01L 27/14603 257/440 |
| 2011/0121162 | A1* | 5/2011 | Murata | H01L 27/14603 250/208.1 |
| 2013/0070133 | A1* | 3/2013 | Takazawa | H04N 5/335 348/294 |
| 2013/0141620 | A1* | 6/2013 | Nakajima | H04N 5/335 348/302 |
| 2015/0077602 | A1* | 3/2015 | Sambonsugi | H04N 5/378 348/296 |
| 2015/0279899 | A1* | 10/2015 | Kim | H01L 27/1463 250/208.1 |
| 2016/0049432 | A1* | 2/2016 | Otaka | H01L 27/14614 348/308 |

FOREIGN PATENT DOCUMENTS

| | | |
|---|---|---|
| JP | 2012-244331 A | 12/2012 |
| JP | 2012-248953 A | 12/2012 |
| JP | 2013-9301 A | 1/2013 |

* cited by examiner

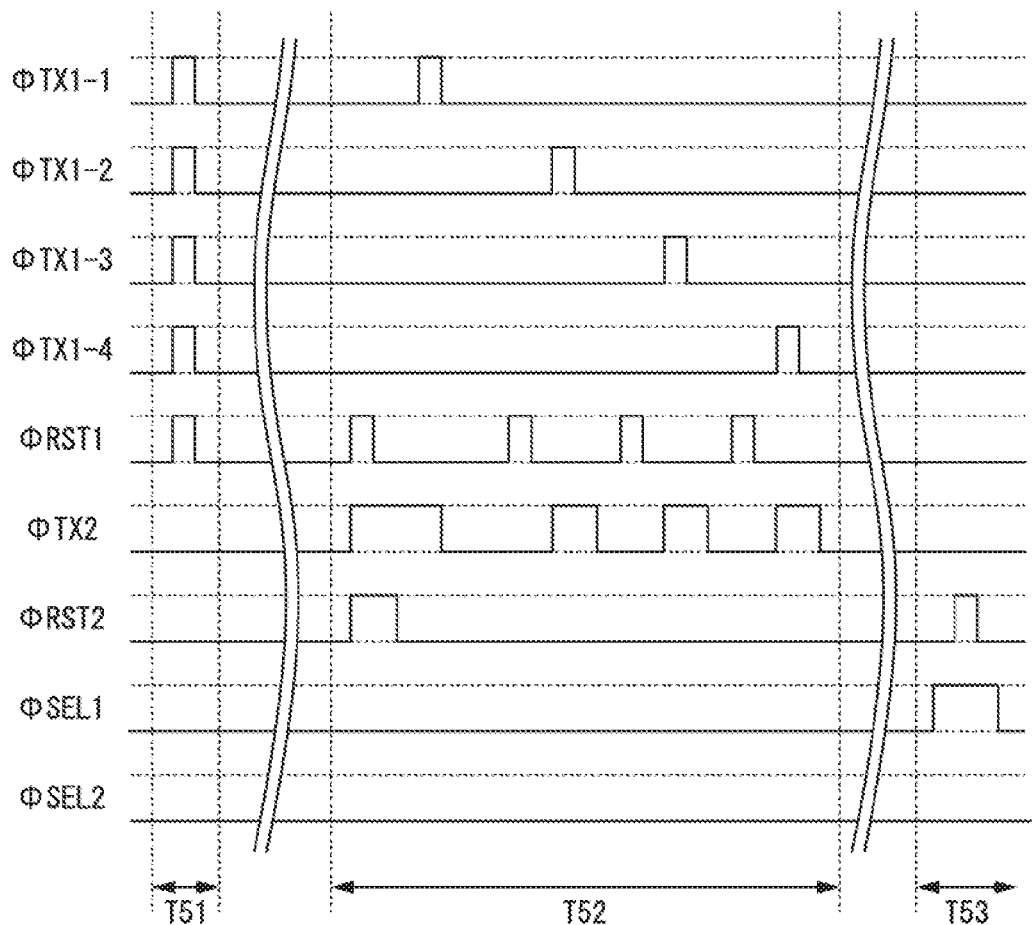

SOLID-STATE IMAGING DEVICE AND IMAGING APPARATUS

This application is a continuation application of PCT Patent Application No. PCT/JP2014/076572, filed Oct. 3, 2014, whose priority is claimed on Japanese Patent Application No. 2013-232228, filed Nov. 8, 2013. The contents of the Japanese Patent Application and the PCT Patent Application are incorporated herein by reference.

BACKGROUND OF THE INVENTION

Field of the Invention

The present invention relates to a solid-state imaging device in which a first substrate and a second substrate are electrically connected by a connection section, and an imaging apparatus.

Description of Related Art

In recent years, in general, video cameras, electronic still cameras, etc. have become widely used. Charge-coupled device (CCD) type or amplification type solid-state imaging devices are used for such cameras. Amplification type solid-state imaging devices guide signal charges generated and stored by photoelectric conversion elements of pixels on which light is incident to amplification units provided at the pixels, and output signals amplified by the amplification units from the pixels. In an amplification type solid-state imaging device, such a plurality of pixels are arranged in a two-dimensional matrix form. Examples of amplification type solid-state imaging devices may include complementary metal oxide semiconductor (CMOS) type solid-state imaging devices, etc. using CMOS transistors.

In the related art, general CMOS type solid-state imaging devices adopt a method of sequentially reading signal charges generated by photoelectric conversion elements of pixels arranged in a two-dimensional matrix form for every row. In such a method, since exposure timings in the photoelectric conversion elements of the pixels are determined depending on starts and ends of reading of signal charges, exposure timings for every row differ. For this reason, when fast-moving subjects are captured using such CMOS type solid-state imaging devices, the subjects are distorted in captured images.

A simultaneous imaging function (a global shutter function) of realizing simultaneousness of storage of signal charges has been suggested to resolve such distortion of subjects. Also, CMOS type solid-state imaging devices having the global shutter function have been used for various purposes. CMOS type solid-state imaging devices having the global shutter function normally need to include storage units with a light-shielding property to store signal charges generated by photoelectric conversion elements until reading thereof is performed. Such conventional CMOS type solid-state imaging devices simultaneously expose all pixels, simultaneously transfer signal charges generated by photoelectric conversion elements from all of the pixels to the storage units, store transferred signal charges once, sequentially convert the signal charges into pixel signals at predetermined reading timings, and read the pixel signals.

However, in conventional CMOS type solid-state imaging devices having the global shutter function, photoelectric conversion elements and storage units should be built on the same plane of the same substrate, and thus an increase of a chip area cannot be avoided. In addition, quality of signals may deteriorate due to noise caused by light and noise caused by leakage currents (dark currents) generated in the storage units during the waiting period until the signal charges stored in the storage units are read.

In order to resolve such problems, a method of preventing an increase of a chip area and reducing noise using a solid-state imaging device in which a first substrate provided with photoelectric conversion elements and a second substrate provided with analog memories (corresponding to storage units) configured to store signal charges generated by the photoelectric conversion elements are adhered is disclosed in Japanese Unexamined Patent Application, First Publication No. 2013-9301. In the solid-state imaging device disclosed in Japanese Unexamined Patent Application, First Publication No. 2013-9301, two substrates are connected to each other by connection sections, and each of the connection sections is shared by two pixels. That is, signal charges generated by two photoelectric conversion elements are transferred to the second substrate from the first substrate via common connection sections, and are stored in two analog memories corresponding to the respective photoelectric conversion elements. Therefore, for example, when each of the connection sections is shared by four pixels, signal charges generated by four photoelectric conversion elements are transferred to the second substrate from the first substrate via common connection sections, and are stored in four analog memories corresponding to the respective photoelectric conversion elements.

SUMMARY OF THE INVENTION

According to a first aspect of the present invention, a solid-state imaging device includes: a first substrate; a second substrate disposed at a position facing the first substrate; a plurality of first photoelectric conversion elements disposed on the first substrate and configured to generate signal charges corresponding to incident light; a plurality of second photoelectric conversion elements different from the plurality of first photoelectric conversion elements, disposed on the first substrate, and configured to generate signal charges corresponding to incident light; a plurality of connection sections disposed between the first substrate and the second substrate, each of the plurality of connection sections being connected to one corresponding first photoelectric conversion element among the plurality of first photoelectric conversion elements and one corresponding second photoelectric conversion element among the plurality of second photoelectric conversion elements; a plurality of storage units disposed on the second substrate and configured to store signal charges output only from the plurality of first photoelectric conversion elements among the plurality of first photoelectric conversion elements and the plurality of second photoelectric conversion elements, each of the plurality of storage units being connected to one corresponding connection section among the plurality of connection sections; and a control unit disposed on the first substrate or the second substrate and including a plurality of selection switches each of which is connected to one corresponding connection section among the plurality of connection sections, the control unit being configured to control operations of (i) a first mode of outputting first signals based on the signal charges output only from the plurality of first photoelectric conversion elements among the plurality of first photoelectric conversion elements and the plurality of second photoelectric conversion elements and stored in the plurality of storage units, and (ii) a second mode of outputting second signals based on the signal charges output from the plurality of first photoelectric conversion elements and the plurality of second photoelectric conversion elements without allowing the second signals to pass through the plurality of storage units.

According to a second aspect of the present invention, in the solid-state imaging device according to the first aspect of the present invention, the plurality of first photoelectric conversion elements and the plurality of second photoelectric conversion elements may be arranged in a matrix form. In the first mode, the control unit may perform control of storing signal charges which are simultaneously output from the plurality of first photoelectric conversion elements disposed in different rows in the plurality of storage units and sequentially outputting the first signals based on the signal charges stored in the plurality of storage units.

According to a third aspect of the present invention, in the solid-state imaging device according to the first aspect of the present invention, the plurality of first photoelectric conversion elements and the plurality of second photoelectric conversion elements may be arranged in a matrix form. In the second mode, the control unit may perform control of sequentially outputting the second signals based on signal charges which are sequentially output from the plurality of first photoelectric conversion elements and the plurality of second photoelectric conversion elements which are arranged in different rows without allowing the second signals to pass through the plurality of storage units.

According to a fourth aspect of the present invention, in the solid-state imaging device according to the first aspect of the present invention, the plurality of first photoelectric conversion elements and the plurality of second photoelectric conversion elements may be arranged in a matrix form to correspond to an array constituted by a plurality of color filters of colors. The first photoelectric conversion elements may be arranged in rows at relatively identical positions in a plurality of groups including the first photoelectric conversion elements and the second photoelectric conversion elements.

According to a fifth aspect of the present invention, in the solid-state imaging device according to the first aspect of the present invention, the plurality of first photoelectric conversion elements and the plurality of second photoelectric conversion elements may be arranged to correspond to an array constituted by a plurality of color filters of colors. The plurality of storage units may store signal charges output from the plurality of first photoelectric conversion elements corresponding to the same color and added.

According to a sixth aspect of the present invention, the solid-state imaging device according to the fifth aspect of the present invention may further include: a plurality of addition units disposed on the first substrate or the second substrate and configured to add signal charges output from the plurality of first photoelectric conversion elements corresponding to the same color. The plurality of storage units may store signal charges added by the plurality of addition units.

According to a seventh aspect of the present invention, in the solid-state imaging device according to the fifth aspect of the present invention, the plurality of storage units may add and store signal charges output from the plurality of first photoelectric conversion elements corresponding to the same color.

According to an eighth aspect of the present invention, the solid-state imaging device according to the first aspect of the present invention may further include: a plurality of first output units disposed on the second substrate, connected to output signal lines, and configured to output the first signals to the output signal lines in the first mode; and a plurality of second output units disposed on the second substrate, connected to the output signal lines, and configured to output the second signals to the output signal lines in the second mode.

According to a ninth aspect of the present invention, the solid-state imaging device according to the first aspect of the present invention may further include: a plurality of clamp capacitors disposed on the first substrate or the second substrate and configured to store signal charges output from the plurality of first photoelectric conversion elements; and a plurality of sample and hold units disposed on the first substrate or the second substrate and configured to acquire signals based on signal charges stored in the plurality of clamp capacitors and to store signal charges based on the acquired signals in the plurality of storage units.

According to a tenth aspect of the present invention, a solid-state imaging device includes: a first substrate; a second substrate disposed at a position facing the first substrate; a plurality of photoelectric conversion elements disposed on the first substrate to correspond to an array constituted by a plurality of color filters of colors and configured to generate signal charges corresponding to incident light; a plurality of connection sections disposed between the first substrate and the second substrate and connected to the plurality of photoelectric conversion elements corresponding to the plurality of color filters; a plurality of storage units disposed on the second substrate and configured to store signal charges output and added from the plurality of photoelectric conversion elements; and a control unit disposed on the first substrate or the second substrate and including a plurality of selection switches each of which is connected to one corresponding connection section among the plurality of connection sections, the control unit being configured to control operations of (i) a first mode of outputting first signals based on signal charges output from the plurality of photoelectric conversion elements and stored in the plurality of storage units, and (ii) a second mode of outputting second signals based on signal charges output from the plurality of photoelectric conversion elements without allowing the second signals to pass through the plurality of storage units.

According to an eleventh aspect of the present invention, the solid-state imaging device according to the tenth aspect of the present invention may further include: a plurality of addition units disposed on the first substrate or the second substrate and configured to add signal charges output from the plurality of photoelectric conversion elements corresponding to the same color. The plurality of storage units may store signal charges added by the plurality of addition units.

According to a twelfth aspect of the present invention, in the solid-state imaging device according to the eleventh aspect of the present invention, the plurality of storage units may add and store signal charges output from the plurality of photoelectric conversion units corresponding to the same color.

According to a thirteenth aspect of the present invention, an imaging apparatus includes the solid-state imaging device according to the first or tenth aspect of the present invention.

BRIEF DESCRIPTION OF THE DRAWINGS

FIG. 15 is a timing chart illustrating operations of the pixels included in the solid-state imaging device according to the fourth embodiment of the present invention.

DETAILED DESCRIPTION OF THE INVENTION

Hereinafter, embodiments of the present invention will be described with reference to the drawings.

First Embodiment

Figure 1:
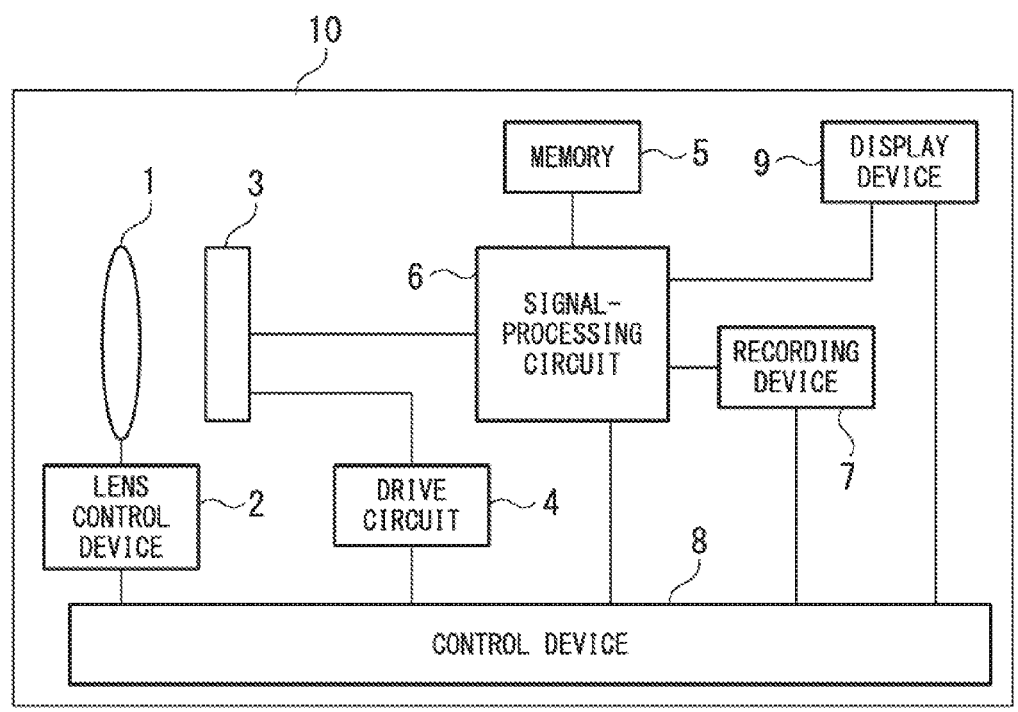
FIG. 1 is a block diagram showing a constitution of an imaging apparatus to which a solid-state imaging device according to a first embodiment of the present invention is applied.

First, a first embodiment of the present invention will be described. FIG. 1 shows a constitution of a digital camera as an example of an imaging apparatus to which a solid-state imaging device according to the embodiment is applied. The imaging apparatus according to an aspect of the present invention may be an electronic device having an imaging function and may be a digital video camera, an endoscope, etc. in addition to a digital camera. A digital camera 10 shown in FIG. 1 includes a lens unit 1, a lens control device 2, a solid-state imaging device 3, a drive circuit 4, a memory 5, a signal-processing circuit 6, a recording device 7, a control device 8, and a display device 9.

The lens unit 1 includes zoom lenses and focusing lenses and forms an image of light from a subject on a light-receiving surface of the solid-state imaging device 3 as a subject image. The lens control device 2 controls zoom, focus, a diaphragm, etc. of the lens unit 1. An image of light captured through the lens unit 1 is formed on the light-receiving surface of the solid-state imaging device 3. The solid-state imaging device 3 converts the subject image formed on the light-receiving surface into an image signal and outputs the image signal. A plurality of pixels are two-dimensionally arranged on the light-receiving surface of the solid-state imaging device 3 in a row direction and a column direction.

The drive circuit 4 drives the solid-state imaging device 3 and controls operations thereof. The memory 5 temporarily stores image data. The signal-processing circuit 6 performs predetermined processing on image signals output from the solid-state imaging device 3. Processes performed by the signal-processing circuit 6 include amplification of an image signal, various corrections of image data, compression of image data, etc.

The recording device 7 is constituted by a semiconductor memory for recording or reading image data, etc. and is detachably built in the digital camera 10. The display device 9 displays a moving image (a live view image), a still image, a moving image and a still image recorded on the recording device 7, a state of the digital camera 10, etc.

The control device 8 controls the entire digital camera 10. Operations of the control device 8 are defined in a program stored in a ROM built in the digital camera 10. The control device 8 reads such a program and performs various types of control in accordance with the content defined by the program.

Figure 2:
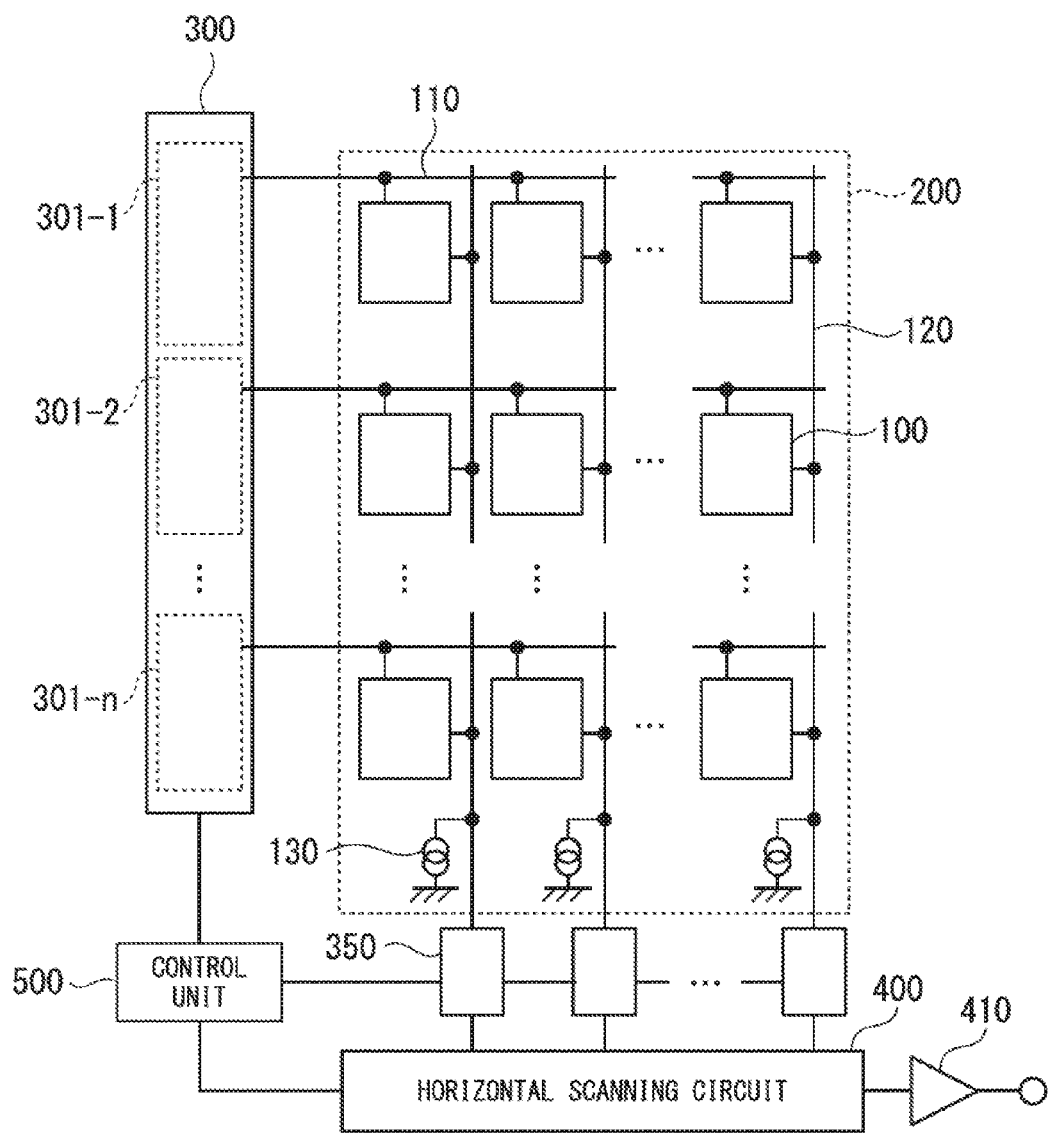
FIG. 2 is a block diagram showing a constitution of the solid-state imaging device according to the first embodiment of the present invention.

FIG. 2 shows a constitution of the solid-state imaging device 3. The solid-state imaging device shown in FIG. 2 includes a pixel unit 200 (a pixel array), a vertical scanning circuit 300, column-processing circuits 350, a horizontal scanning circuit 400, an output amplifier 410, and a control unit 500. Arrangement positions of circuit elements shown in FIG. 2 may not necessarily coincide with actual arrangement positions.

The pixel unit 200 includes pixels 100 arranged in a two-dimensional matrix form and current sources 130 provided for every column. In the embodiment, a region formed by all pixels of the solid-state imaging device 3 is set as a reading target region of pixel signals, but a part of a region formed by all of the pixels of the solid-state imaging device 3 may be set as the reading target region. The reading target region preferably includes at least all pixels of an effective pixel region. Also, the reading target region may include optical black pixels (pixels from which light is always shielded) disposed outside the effective pixel region. Pixel signals read from the optical black pixels are, for example, used to correct dark current components.

The vertical scanning circuit 300 performs drive control on the pixel unit 200 in units of rows. The vertical scanning circuit 300 is constituted by unit circuits 301-1, 301-2, . . . , and 301-n (n is the number of rows) equal in number to the rows to perform such drive control.

Each of the unit circuits 301-i (i=1, 2, . . . , and n) outputs a control signal for controlling the pixels 100 of one row to one of signal lines 110 provided for every row. Each of the signal lines 110 is connected to the pixels 100 and supplies the control signal output from each of the unit circuits 301-i to the pixels 100. In FIG. 2, each of the signal lines 110 corresponding to each row is expressed by one line, but each of the signal lines 110 includes a plurality of signal lines. Signals of the pixels 100 of the row selected by the control signal are output to each of vertical signal lines 120 provided for every column.

The current sources 130 are connected to the vertical signal lines 120 and constitute source follower circuits with amplifier transistors (second amplifier transistors 241 to be described below) in the pixels 100. Column-processing circuits 350 perform signal processing such as noise suppression on pixel signals output to the vertical signal lines 120. The horizontal scanning circuit 400 chronologically outputs pixel signals of the pixels 100 of one row output to the vertical signal lines 120 and processed by the column-processing circuits 350 to an output amplifier 410. The output amplifier 410 amplifies the pixel signals output from the horizontal scanning circuit 400 and outputs the amplified pixel signals to the outside of the solid-state imaging device 3 as image signals. The control unit 500 controls the vertical scanning circuit 300, the column-processing circuits 350, and the horizontal scanning circuit 400 to control reading of the pixel signals.

Figure 3:
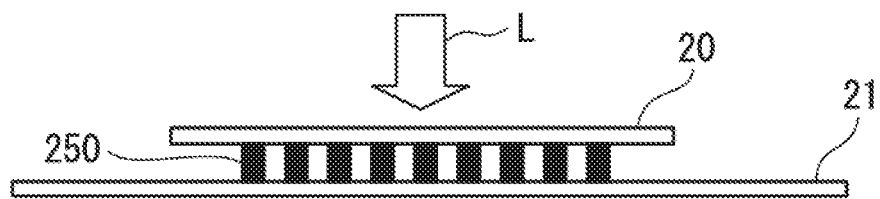
FIG. 3 is a cross-sectional view of the solid-state imaging device according to the first embodiment of the present invention.

FIG. 3 shows a cross-sectional structure of the solid-state imaging device 3. The solid-state imaging device 3 has a structure in which two substrates (a first substrate 20 and a second substrate 21), in which circuit elements (photoelectric conversion elements, transistors, capacitors, etc.) constituting the pixels 100 are arranged, overlap with each other. The circuit elements constituting the pixels 100 are distributed and disposed on the first substrate 20 and the second substrate 21. The first substrate 20 and the second substrate 21 are electrically connected to each other such that electrical signals can be exchanged between the two substrates when the pixels 100 are driven.

Photoelectric conversion elements are formed on a main surface side of a side irradiated with light L between two main surfaces (surfaces having a relatively larger surface area than lateral surfaces) of the first substrate 20, and the light radiated to the first substrate 20 is incident on the photoelectric conversion elements. Connection sections 250 for connecting with the second substrate 21 are formed on a main surface of a side opposite to the main surface of the side irradiated with the light L between the two main surfaces of the first substrate 20. Signals based on signal charges generated by the photoelectric conversion elements disposed in the first substrate 20 are output to the second substrate 21 via each of the connection sections 250. In the example shown in FIG. 3, areas of the main surfaces of the first substrate 20 and the second substrate 21 differ from each other, but the areas of the main surfaces of the first substrate 20 and the second substrate 21 may be the same.

Components other than the pixels 100, i.e., the vertical scanning circuit 300, the column-processing circuits 350, the horizontal scanning circuit 400, the output amplifier 410, and the control unit 500, may be disposed on either the first substrate 20 or the second substrate 21. Also, circuit elements constituting each of the vertical scanning circuit 300, the column-processing circuits 350, the horizontal scanning circuit 400, the output amplifier 410, and the control unit 500 may be distributed and disposed on the first substrate 20 and the second substrate 21.

Figure 4:
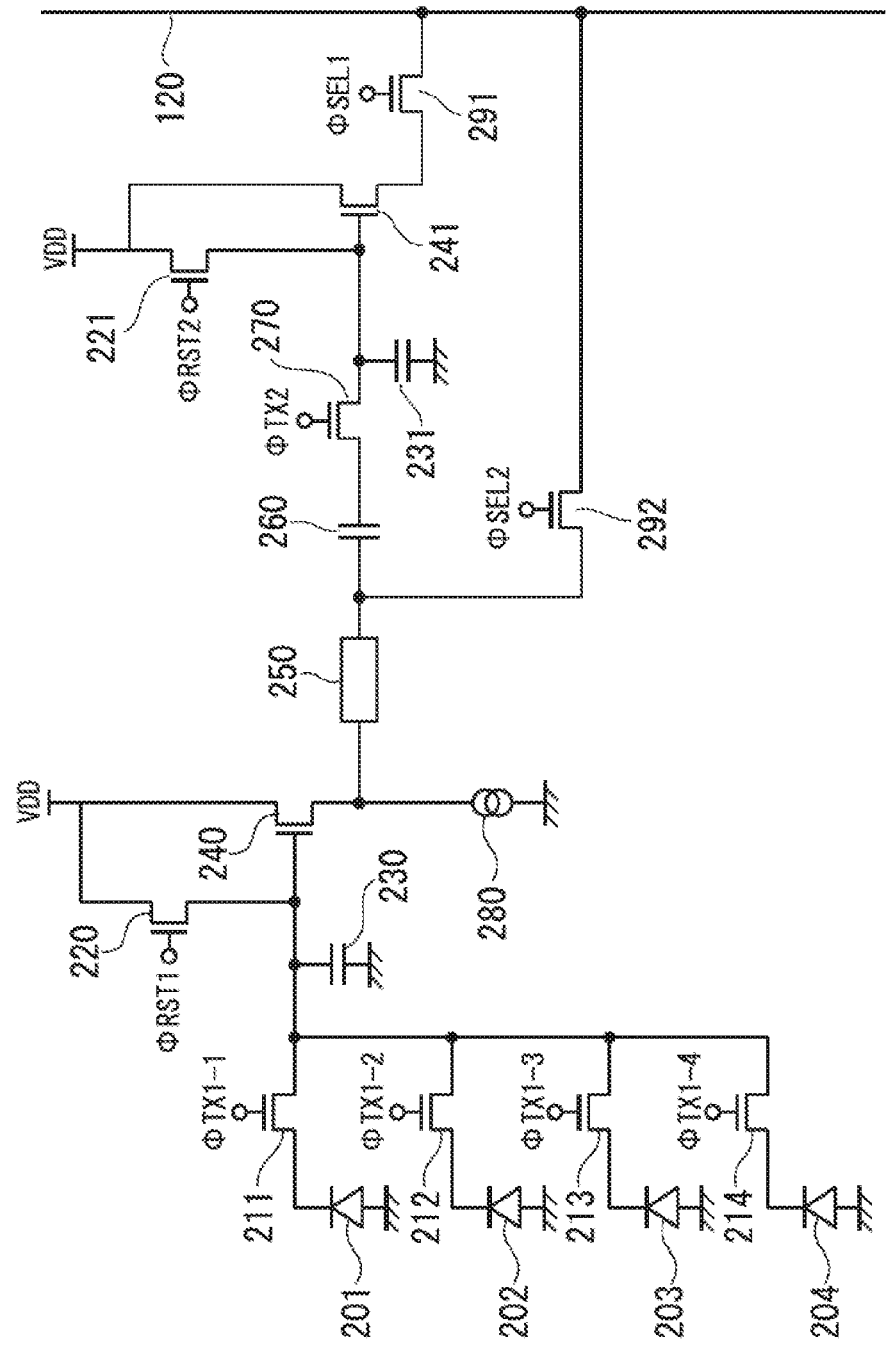
FIG. 4 is a circuit diagram showing a circuit constitution of pixel cells included in the solid-state imaging device according to the first embodiment of the present invention.

FIG. 4 shows a circuit constitution of pixel cells constituted by four of the pixels 100. In the embodiment, a case in which some circuit elements are shared by the four pixels arranged in a vertical direction will be described. The pixel cells constituted by the four pixels 100 include photoelectric conversion elements 201, 202, 203, and 204, transfer transistors 211, 212, 213, and 214, a charge-holding unit 230 (floating diffusion), a first reset transistor 220, a first amplifier transistor 240, a current source 280, a clamp capacitor 260, a sample and hold transistor 270, a second reset transistor 221, a sample and hold capacitor 231, a second amplifier transistor 241, a first selection transistor 291, and a second selection transistor 292. Arrangement positions of circuit elements shown in FIG. 4 may not necessarily coincide with actual arrangement positions.

The circuit elements of the four pixels 100 are included in the pixel cells. A first pixel includes the photoelectric conversion element 201, the transfer transistor 211, the charge-holding unit 230, the first reset transistor 220, the first amplifier transistor 240, the current source 280, the clamp capacitor 260, the sample and hold transistor 270, the second reset transistor 221, the sample and hold capacitor 231, the second amplifier transistor 241, the first selection transistor 291, and the second selection transistor 292. A second pixel includes the photoelectric conversion element 202, the transfer transistor 212, the charge-holding unit 230, the first reset transistor 220, the first amplifier transistor 240, the current source 280, the clamp capacitor 260, the sample and hold transistor 270, the second reset transistor 221, the sample and hold capacitor 231, the second amplifier transistor 241, the first selection transistor 291, and the second selection transistor 292.

A third pixel includes the photoelectric conversion element 203, the transfer transistor 213, the charge-holding unit 230, the first reset transistor 220, the first amplifier transistor 240, the current source 280, the clamp capacitor 260, the sample and hold transistor 270, the second reset transistor 221, the sample and hold capacitor 231, the second amplifier transistor 241, the first selection transistor 291, and the second selection transistor 292. A fourth pixel includes the photoelectric conversion element 204, the transfer transistor 214, the charge-holding unit 230, the first reset transistor 220, the first amplifier transistor 240, the current source 280, the clamp capacitor 260, the sample and hold transistor 270, the second reset transistor 221, the sample and hold capacitor 231, the second amplifier transistor 241, the first selection transistor 291, and the second selection transistor 292. The charge-holding unit 230, the first reset transistor 220, the first amplifier transistor 240, the current source 280, the clamp capacitor 260, the sample and hold transistor 270, the second reset transistor 221, the sample and hold capacitor 231, the second amplifier transistor 241, the first selection transistor 291, and the second selection transistor 292 are shared by the four pixels 100.

One end of each of the photoelectric conversion elements 201, 202, 203, and 204 is grounded. Drain terminals of the transfer transistors 211, 212, 213, and 214 are connected to the other ends of the photoelectric conversion elements 201, 202, 203, and 204, respectively. Gate terminals of the transfer transistors 211, 212, 213, and 214 are connected to the vertical scanning circuit 300, and are supplied with transfer pulses ΦTX1-1, ΦTX1-2, ΦTX1-3, and ΦTX1-4, respectively.

One end of the charge-holding unit 230 is connected to source terminals of the transfer transistors 211, 212, 213, and 214, and the other end of the charge-holding unit 230 is grounded. A drain terminal of the first reset transistor 220 is connected to a power supply voltage VDD, and a source terminal of the first reset transistor 220 is connected to the source terminals of the transfer transistors 211, 212, 213, and 214. A gate terminal of the first reset transistor 220 is connected to the vertical scanning circuit 300 and is supplied with a reset pulse ΦRST1.

A drain terminal of the first amplifier transistor 240 is connected to the power supply voltage VDD. A gate terminal serving as an input unit of the first amplifier transistor 240 is connected to the source terminals of the transfer transistors 211, 212, 213, and 214. One end of the current source 280 is connected to a source terminal of the first amplifier transistor 240, and the other end of the current source 280 is grounded. As an example, the current source 280 may be constituted by a transistor in which a drain terminal thereof is connected to the source terminal of the first amplifier transistor 240, a source terminal thereof is grounded, and a gate terminal thereof is connected to the vertical scanning circuit 300. One end of the clamp capacitor 260 is connected to the source terminal of the first amplifier transistor 240 and the one end of the current source 280 via the connection section 250.

A drain terminal of the sample and hold transistor 270 is connected to the other end of the clamp capacitor 260. A gate terminal of the sample and hold transistor 270 is connected to the vertical scanning circuit 300 and is supplied with a sample and hold pulse ΦTX2. A drain terminal of the second reset transistor 221 is connected to the power supply voltage VDD, and a source terminal of the second reset transistor 221 is connected to a source terminal of the sample and hold transistor 270. A gate terminal of the second reset transistor 221 is connected to the vertical scanning circuit 300 and is supplied with a reset pulse ΦRST2.

One end of the sample and hold capacitor 231 is connected to the source terminal of the sample and hold transistor 270, and the other end of the sample and hold capacitor 231 is grounded. A drain terminal of the second amplifier transistor 241 is connected to the power supply voltage VDD. A gate terminal constituting an input unit of the second amplifier transistor 241 is connected to the source terminal of the sample and hold transistor 270. A drain terminal of the first selection transistor 291 is connected to a source terminal of the second amplifier transistor 241, and a source terminal of the first selection transistor 291 is connected to the vertical signal lines 120. A gate terminal of the first selection transistor 291 is connected to the vertical scanning circuit 300 and is supplied with a selection pulse ΦSEL1.

A drain terminal of the second selection transistor 292 is connected to the source terminal of the first amplifier transistor 240 and the one end of the current source 280 via the connection section 250. A source terminal of the second selection transistor 292 is connected to the vertical signal lines 120. A gate terminal of the second selection transistor 292 is connected to the vertical scanning circuit 300 and is supplied with a selection pulse ΦSEL2. Polarities of the above-mentioned transistors may be reversed, and the source terminals and the drain terminals may be opposite to the above.

The photoelectric conversion elements 201, 202, 203, and 204 are, for example, photodiodes, generate (produce) signal charges based on an amount of incident light, and hold and store the generated (produced) signal charges. The transfer transistors 211, 212, 213, and 214 are transistors which transfer the signal charges stored in the photoelectric conversion elements 201, 202, 203, and 204 to the charge-holding unit 230. On/off of the transfer transistors 211, 212, 213, and 214 is controlled by the transfer pulses ΦTX1-1, ΦTX1-2, ΦTX1-3, and ΦTX1-4 from the vertical scanning circuit 300, respectively. The charge-holding unit 230 is a floating diffusion capacitor which temporarily holds and stores the signal charges transferred from the photoelectric conversion elements 201, 202, 203, and 204.

The first reset transistor 220 is a transistor which resets the charge-holding unit 230. On/off of the first reset transistor 220 is controlled by the reset pulse ΦRST1 from the vertical scanning circuit 300. The first reset transistor 220 and the transfer transistors 211, 212, 213, and 214 are simultaneously turned on so that the photoelectric conversion elements 201, 202, 203, and 204 can also be reset. The reset of the charge-holding unit 230/the photoelectric conversion elements 201, 202, 203, and 204 means that the amount of charge stored in the charge-holding unit 230/the photoelectric conversion elements 201, 202, 203, and 204 is controlled to set states (potentials) of the charge-holding unit 230/the photoelectric conversion elements 201, 202, 203, and 204 to reference states (reference potentials or reset levels).

The first amplifier transistor 240 is a transistor which outputs amplified signals obtained by amplifying signals based on the signal charges stored in the charge-holding unit 230, which are input to its gate terminal, from its source terminal. The current source 280 functions as a load of the first amplifier transistor 240 and supplies a current driving the first amplifier transistor 240 to the first amplifier transistor 240. The first amplifier transistor 240 and the current source 280 constitute a source follower circuit.

The clamp capacitor 260 is a capacitor which clamps (fixes) a voltage level of the amplified signal output from the first amplifier transistor 240. The sample and hold transistor 270 is a transistor which samples and holds a voltage level of the other end of the clamp capacitor 260 and stores a signal charge in the sample and hold capacitor 231. On/off of the sample and hold transistor 270 is controlled by the sample and hold pulse ΦTX2 from the vertical scanning circuit 300.

The second reset transistor 221 is a transistor which resets the sample and hold capacitor 231. On/off of the second reset transistor 221 is controlled by the reset pulse ΦRST2 from the vertical scanning circuit 300. The reset of the sample and hold capacitor 231 means that the amount of charge stored in the sample and hold capacitor 231 is controlled to set a state (a potential) of the sample and hold capacitor 231 to a reference state (a reference potential or a reset level). The sample and hold capacitor 231 holds and stores signal charges based on analog signals sampled and held by the sample and hold transistor 270.

Capacitance of the sample and hold capacitor 231 is set to larger capacitance than the charge-holding unit 230. A metal insulator metal (MIM) capacitor serving as a capacitor with a small leakage current (dark current) per unit area is more preferably used for the sample and hold capacitor 231. Thus, noise resistance is improved, and a high-quality signal is acquired.

The second amplifier transistor 241 is a transistor which outputs amplified signals obtained by amplifying signals based on the signal charges stored in the sample and hold capacitor 231, which are input to its gate terminal, from its source terminal. The second amplifier transistor 241 and the current source 130, which is connected to the vertical signal line 120, constitute a source follower circuit. The first selection transistor 291 is a transistor which selects the pixels 100 and transmits an output of the second amplifier transistor 241 to the vertical signal line 120. On/off of the first selection transistor 291 is controlled by the selection pulse ΦSEL1 from the vertical scanning circuit 300. The second selection transistor 292 is a transistor which selects the pixels 100 and transmits an output of the first amplifier transistor 240 to the vertical signal line 120. On/off of the second selection transistor 292 is controlled by the selection pulse ΦSEL2 from the vertical scanning circuit 300.

The photoelectric conversion elements 201, 202, 203, and 204, the transfer transistors 211, 212, 213, and 214, the charge-holding unit 230, the first reset transistor 220, the first amplifier transistor 240, and the current source 280 among the circuit elements shown in FIG. 4 are disposed on the first substrate 20. Also, the clamp capacitor 260, the sample and hold transistor 270, the second reset transistor 221, the sample and hold capacitor 231, the second amplifier transistor 241, the first selection transistor 291, and the second selection transistor 292 are disposed on the second substrate 21.

The connection section 250 is disposed between the first substrate 20 and the second substrate 21. The amplified signals output from the first amplifier transistor 240 of the first substrate 20 are output to the second substrate 21 via the connection section 250.

In FIG. 4, the connection section 250 is disposed on a path of the source terminal of the first amplifier transistor 240 and the one end of the current source 280 with the one end of the clamp capacitor 260 and the drain terminal of the second selection transistor 292, but is not limited thereto. The connection section 250 may be disposed on paths which are electrically connected from the transfer transistors 211, 212, 213, and 214 to the sample and hold capacitor 231.

For example, the connection section 250 may be disposed on a path of the source terminals of the transfer transistors 211, 212, 213, and 214 with the one end of the charge-holding unit 230, the source terminal of the first reset transistor 220, and the gate terminal of the first amplifier transistor 240. Alternatively, the connection section 250 may be disposed on a path between the other end of the clamp capacitor 260 and the drain terminal of the sample and hold transistor 270. In this case, another connection section is disposed on a path of the source terminal of the first amplifier transistor 240, the one end of the current source 280, and the one end of the clamp capacitor 260 with the drain terminal of the second selection transistor 292.

Alternatively, the connection section 250 may be disposed on a path of the source terminal of the sample and hold transistor 270 with the one end of the sample and hold capacitor 231, the source terminal of the second reset transistor 221, and the gate terminal of the second amplifier transistor 241. In this case, another connection section is disposed on a path of the source terminal of the first amplifier transistor 240, the one end of the current source 280, and the one end of the clamp capacitor 260 with the drain terminal of the second selection transistor 292. Therefore, the first reset transistor 220, the charge-holding unit 230, the first amplifier transistor 240, the current source 280, the clamp capacitor 260, and the sample and hold transistor 270 among the circuit elements shown in FIG. 4 are disposed on the first substrate 20 or the second substrate 21.

Row positions of the four pixels 100 in FIG. 4 differ from each other. A constitution of the four pixels 100 in four rows and one column among the plurality of pixels 100 arranged in a matrix form is shown in FIG. 4. When the constitution shown in FIG. 4 is a unit constitution, the solid-state imaging device according to the embodiment includes the plurality of unit constitutions. Therefore, the solid-state imaging device according to the embodiment includes the plurality of photoelectric conversion elements 201, 202, 203, and 204, the plurality of transfer transistors 211, 212, 213, and 214, the plurality of charge-holding units 230 (floating diffusion), the plurality of first reset transistors 220, the plurality of first amplifier transistors 240, the plurality of current sources 280, the plurality of clamp capacitors 260, the plurality of sample and hold transistors 270, the plurality of second reset transistors 221, the plurality of sample and hold capacitors 231, the plurality of second amplifier transistors 241, the plurality of first selection transistors 291, and the plurality of second selection transistors 292.

Characteristic constitutions of the solid-state imaging device according to the embodiment are the photoelectric conversion elements 201, 202, 203, and 204, the sample and hold capacitor 231, and the control unit 500. Constitutions other than these constitutions are not essential constitutions to acquire an effect capable of relaxing restriction on the space in which the storage unit is disposed. The sample and hold capacitor 231 is an example of the storage unit. The photoelectric conversion elements 201, 202, 203, and 204 are divided into a first photoelectric conversion element (e.g., the photoelectric conversion element 201) from which signal charges are read both when moving images are photographed and when still images are photographed and second photoelectric conversion elements (e.g., the photoelectric conversion elements 202, 203, and 204) from which signal charges are read only when still images are photographed. The plurality of first photoelectric conversion elements and the plurality of second photoelectric conversion elements are arranged in a matrix form. As described above, the solid-state imaging device according to the embodiment includes the plurality of photoelectric conversion elements 201, 202, 203, and 204 and the plurality of sample and hold capacitors 231.

The plurality of first photoelectric conversion elements are arranged on the first substrate 20 and generate signal charges corresponding to incident light. The plurality of second photoelectric conversion elements different from the plurality of first photoelectric conversion elements are arranged on the first substrate 20 and generate signal charges corresponding to incident light. The plurality of sample and hold capacitors 231 are arranged on the second substrate 21 and store signal charges output only from the plurality of first photoelectric conversion elements among the plurality of first photoelectric conversion elements and the plurality of second photoelectric conversion elements. In the embodiment, when the solid-state imaging device 3 is operated in a first mode corresponding to photographing moving images, the signal charges output only from the plurality of first photoelectric conversion elements are stored in the plurality of sample and hold capacitors 231. Also, in the embodiment, when the solid-state imaging device 3 is operated in a second mode corresponding to photographing still images, signals based on the signal charges output from the plurality of first photoelectric conversion elements and the plurality of second photoelectric conversion elements are output to the vertical signal lines 120 without passing through the plurality of sample and hold capacitors 231.

The control unit 500 is disposed on the first substrate 20 or the second substrate 21 and controls operations of the first mode of outputting first signals based on the signal charges output only from the plurality of first photoelectric conversion elements among the plurality of first photoelectric conversion elements and the plurality of second photoelectric conversion elements and stored in the plurality of sample and hold capacitors 231 and the second mode of outputting second signals based on the signal charges output from the plurality of first photoelectric conversion elements and the plurality of second photoelectric conversion elements without passing through the plurality of sample and hold capacitors 231.

In the first mode, the control unit 500 performs control of storing signal charges which are simultaneously output from the plurality of first photoelectric conversion elements disposed in different rows in the plurality of sample and hold capacitors 231 and sequentially outputting the first signals based on the signal charges stored in the plurality of sample and hold capacitors 231. That is, the plurality of first photoelectric conversion elements are simultaneously exposed through a so-called global shutter operation when moving images are photographed. In the first mode, the start of exposure and the end of the exposure of the plurality of first photoelectric conversion elements included in the same pixel cell may not necessarily be performed simultaneously, and the plurality of first photoelectric conversion elements may be simultaneously exposed at at least any period from the start of exposure to the end of exposure. Also, in the first mode, signal charges are simultaneously output from at least some of the plurality of first photoelectric conversion elements included in the plurality of pixel cells in different rows.

In the second mode, the control unit 500 performs control of sequentially outputting the second signals based on the signal charges which are sequentially output from the plurality of first photoelectric conversion elements and the plurality of second photoelectric conversion elements which are arranged in different rows without passing through the plurality of sample and hold capacitors 231. That is, the plurality of first photoelectric conversion elements and the plurality of second photoelectric conversion elements are sequentially exposed through a so-called rolling shutter operation when still images are photographed. In the second mode, exposure periods of at least some of the plurality of first photoelectric conversion elements and the plurality of second photoelectric conversion elements do not overlap with each other at all.

The plurality of first selection transistors 291 (first output units) which are disposed on the second substrate 21 and connected to the vertical signal lines 120 (output signal lines), and which output the first signals based on the signal charges, which are output only from the first photoelectric conversion elements and stored in the sample and hold capacitor 231 in the first mode, to the vertical signal lines 120 are disposed on a first path in which signals based on the signal charges output from the plurality of first photoelectric conversion elements are output in the first mode.

The plurality of clamp capacitors 260 disposed on the first substrate 20 or the second substrate 21 and which store the signal charges output from the plurality of first photoelectric conversion elements, and the plurality of sample and hold transistors 270 (sample holding units) disposed on the first substrate 20 or the second substrate 21 and which acquire (sample and hold) signals based on the signal charges stored in the plurality of clamp capacitors 260 and store signal charges based on the acquired signals in the plurality of sample and hold capacitors 231 are disposed on the first path.

The plurality of second selection transistors 292 (second output units) disposed on the second substrate 21, connected to the vertical signal lines 120 (output signal lines), and configured to output the second signals based on the signal charges output from the plurality of first photoelectric conversion elements and the plurality of second photoelectric conversion elements to the vertical signal lines 120 in the second mode are disposed on a second path in which signals based on the signal charges output from the plurality of first photoelectric conversion elements and the plurality of second photoelectric conversion elements are output in the second mode.

In the related art, signal charges output from, for example, four photoelectric conversion elements are stored in four storage units corresponding to the respective photoelectric conversion elements when still images are photographed. For this reason, storage units equal in number to the photoelectric conversion elements need to be provided. Therefore, space in which the storage units are disposed can easily become restricted.

In the embodiment, in the first mode corresponding to photographing moving images, the signal charges output only from the first photoelectric conversion elements among the first photoelectric conversion elements and the second photoelectric conversion elements are stored in the storage units. Also, in the second mode corresponding to photographing still images, the signal charges output from the first photoelectric conversion elements and the second photoelectric conversion elements are not stored in the storage units and are output as the second signals. Therefore, since capacitors for storing the signal charges output from the second photoelectric conversion elements need not be provided, restriction on the space in which the storage units are disposed can be relaxed.

Figure 5:
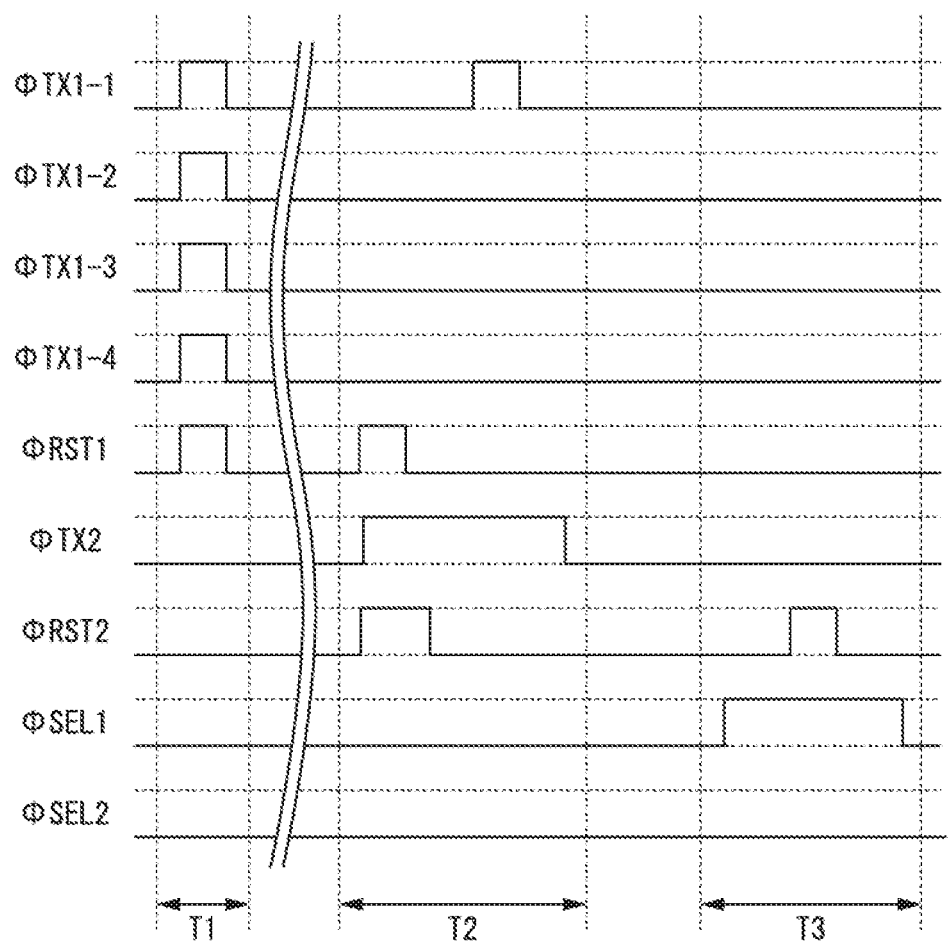
FIG. 5 is a timing chart illustrating operations of pixels included in the solid-state imaging device according to the first embodiment of the present invention.

Next, operations of the pixels 100 will be described. FIG. 5 illustrates the operations of the pixels 100 in the first mode corresponding to photographing moving images. Control signals supplied to the pixels 100 in every row from the vertical scanning circuit 300 are illustrated in FIG. 5. Positions of FIG. 5 in a vertical direction (hereinafter referred to as vertical positions) indicate voltages of the control signals, and positions of FIG. 5 in a horizontal direction (hereinafter referred to as horizontal positions) indicate time positions. Hereinafter, the operations will be described in units of pixel cells constituted by the four pixels shown in FIG. 4.

[Operation of Period T1]

As the reset pulse ΦRST1 changes from an "L" (Low) level to an "H" (High) level, the first reset transistor 220 is turned on. Simultaneously, as the transfer pulses ΦTX1-1, ΦTX1-2, ΦTX1-3, and ΦTX1-4 change from an "L" level to an "H" level, the transfer transistors 211, 212, 213, and 214 are turned on. Thus, the photoelectric conversion elements 201, 202, 203, and 204 of the four pixels 100 are reset.

Subsequently, as the reset pulse ΦRST1 and the transfer pulses ΦTX1-1, ΦTX1-2, ΦTX1-3, and ΦTX1-4 change from the "H" level to the "L" level, the first reset transistor 220 and the transfer transistors 211, 212, 213, and 214 are turned off. Here, the reset of the photoelectric conversion elements 201, 202, 203, and 204 of the four pixels 100 ends, and the exposure of the four pixels 100 (the storage of the signal charges) starts.

[Operation of Period T2]

As the reset pulse ΦRST2 changes from an "L" level to an "H" level, the second reset transistor 221 is turned on. Thus, the sample and hold capacitor 231 is reset. Simultaneously, as the sample and hold pulse ΦTX2 changes from an "L" level to an "H" level, the sample and hold transistor 270 is turned on. Thus, a potential of the other end of the clamp capacitor 260 is reset to the power supply voltage VDD, and the sample and hold transistor 270 starts to sample and hold the potential of the other end of the clamp capacitor 260.

Simultaneously, as the reset pulse ΦRST1 changes from an "L" level to an "H" level, the first reset transistor 220 is turned on. Thus, the charge-holding unit 230 is reset. Subsequently, as the reset pulse ΦRST1 changes from the "H" level to the "L" level, the first reset transistor 220 is turned off. Here, the reset of the charge-holding unit 230 ends. A timing at which the charge-holding unit 230 is reset may be during the exposure period, and the charge-holding unit 230 is reset at the timing just before the end of the exposure period so that noise due to a leakage current of the charge-holding unit 230 can be further reduced.

Subsequently, as the reset pulse ΦRST2 changes from an "H" level to an "L" level, the second reset transistor 221 is turned off Here, the reset of the sample and hold capacitor 231 ends. At this time, the clamp capacitor 260 clamps the amplified signals (the amplified signals after the charge-holding unit 230 is reset) output from the first amplifier transistor 240.

Subsequently, as the transfer pulse ΦTX1-1 changes from an "L" level to an "H" level, the transfer transistor 211 is turned on. Thus, the signal charges stored in the photoelectric conversion element 201 are transferred to the charge-holding unit 230 via the transfer transistor 211 and are stored in the charge-holding unit 230. Here, the exposure of the first pixel (the storage of the signal charges) ends. A period from an exposure start of the first pixel in a period T1 to an exposure end of the first pixel in a period T2 is an exposure period (a signal-storage period). Subsequently, as the transfer pulse ΦTX1-1 changes from the "H" level to the "L" level, the transfer transistor 211 is turned off. At this time, the clamp capacitor 260 clamps the amplified signals (the amplified signals after the signal charges are stored in the charge-holding unit 230) output from the first amplifier transistor 240.

Subsequently as the sample and hold pulse ΦTX2 changes from an "H" level to an "L" level, the sample and hold transistor 270 is turned off. Thus, the sample and hold transistor 270 finishes sampling and holding the potential of the other end of the clamp capacitor 260.

Hereinafter, a change in a potential of the one end of the sample and hold capacitor 231 will be described. When a change in a potential of the one end of the charge-holding unit 230 due to transfer of the signal charges to the charge-holding unit 230 from the photoelectric conversion element 201 after the reset of the charge-holding unit 230 ends is set to ΔVfd and a gain of the first amplifier transistor 240 is set to α1, a change in a potential ΔVamp1 of the source terminal of the first amplifier transistor 240 due to the transfer of the signal charges to the charge-holding unit 230 from the photoelectric conversion elements 201 is α1×ΔVfd.

When the total gain of the sample and hold capacitor 231 and the sample and hold transistor 270 is set to α2, a change in a potential ΔVmem of the one end of the sample and hold capacitor 231 due to sampling and holding of the sample and hold transistor 270 after the signal charges are transferred to the charge-holding unit 230 from the photoelectric conversion element 201 is α2×ΔVamp1, i.e., α1×α2×ΔVfd. ΔVfd is an amount of change in potential of the one end of the charge-holding unit 230 due to transmission of the signal charges, and does not include reset noise generated due to the reset of the charge-holding unit 230. Therefore, the sample and hold transistor 270 samples and holds so that the influence of noise generated in the photoelectric conversion element 201 can be reduced.

Since a potential of the one end of the sample and hold capacitor 231 at a point in time at which the reset of the sample and hold capacitor 231 ends is the power supply voltage VDD, the potential Vmem of the one end of the sample and hold capacitor 231 sampled and held by the sample and hold transistor 270 after the signal charges are transferred to the charge-holding unit 230 from the photoelectric conversion element 201 is as shown in Expression (1). In Expression (1), ΔVmem<0 and ΔVfd<0.

$$Vmem = VDD + \Delta Vmem \quad (1)$$
$$= VDD + \alpha 1 \times \alpha 2 \times \Delta Vfd$$

Also, α2 is as shown in Expression (2). In Expression (2), CL is a capacitance value of the clamp capacitor 260, and CSH is a capacitance value of the sample and hold capacitor 231. Capacitance CL of the clamp capacitor 260 is more preferably greater than capacitance CSH of the sample and hold capacitor 231 to further reduce a decrease of a gain.

$$\alpha 2 = \frac{CL}{CL + CSH} \quad (2)$$

[Operation of Period T3]

In a period T3, signals based on the signal charges stored in the sample and hold capacitor 231 are sequentially read for every row. As the selection pulse ΦSEL1 changes from an "L" level to an "H" level, the first selection transistor 291 is turned on. Thus, signals based on the potential Vmem represented in Expression (1) are output to the vertical signal lines 120 via the first selection transistor 291.

Subsequently, as the reset pulse ΦRST2 changes from an "L" level to an "H" level, the second reset transistor 221 is turned on. Thus, the sample and hold capacitor 231 is reset, and signals based on the potential of the one end of the sample and hold capacitor 231 at the time of resetting are output to the vertical signal lines 120 via the first selection transistor 291.

Subsequently, as the reset pulse ΦRST2 changes from the "H" level to the "L" level, the second reset transistor 221 is turned off. Subsequently, as the selection pulse ΦSEL1 changes from an "H" level to an "L" level, the first selection transistor 291 is turned off.

Each of the column-processing circuits 350 generates a differential signal obtained by taking a difference between a signal based on the potential Vmem represented in Expression (1) and a signal based on the potential of the one end of the sample and hold capacitor 231 when the sample and hold capacitor 231 is reset. The differential signal is a signal based on a difference between the potential Vmem represented in Expression (1) and the power supply voltage VDD, and is a signal based on a difference ΔVfd between the potential of the one end of the charge-holding unit 230 immediately after the signal charge stored in the photoelectric conversion element 201 is transferred to the charge-holding unit 230 and the potential of the charge-holding unit 230 immediately after the one end of the charge-holding unit 230 is reset. Therefore, a signal component based on the signal charge stored in the photoelectric conversion element 201, which is obtained by suppressing a noise component due to the reset of the sample and hold capacitor 231 and a noise component due to the reset of the charge-holding unit 230, can be acquired.

The signals output from the column-processing circuits 350 are output to the output amplifier 410 through the horizontal scanning circuit 400. The output amplifier 410 processes the signals output from the horizontal scanning circuit 400 and outputs the processed signals as image signals. Here, the reading of the signals ends.

In the above-mentioned operations, the charge-holding unit 230 should hold the signal charges transferred to the charge-holding unit 230 from the photoelectric conversion element 201 until a timing at which the pixels 100 are read (a timing at which the selection pulse ΦSEL1 changes to an "H" level in the period T3). When noise is generated during a period in which the charge-holding unit 230 holds the signal charges, the noise is superimposed on the signal charges held by the charge-holding unit 230, and thus signal quality (S/N) deteriorates.

Two main causes of noise generated during a period in which the charge-holding unit 230 holds the signal charges (hereinafter referred to as a holding period) are charges due to a leakage current of the charge-holding unit 230 (hereinafter referred to as leakage charges) and charges caused by light incident on a portion other than the photoelectric conversion elements 201, 202, 203, and 204 (hereinafter referred to as light charges). When the leakage charges and the light charges generated in unit time are set to qid and qpn, respectively, and a length of the holding period is set to tc, noise charges Qn generated during the holding period are (qid+qpn)tc.

Capacitance of the charge-holding unit 230 is set to Cfd, capacitance of the sample and hold capacitor 231 is set to Cmem, and a ratio between Cfd and Cmem (Cmem/Cfd) is set to A. Also, as described above, the gain of the first amplifier transistor 240 is set to $\alpha 1$, and the total gain of the sample and hold capacitor 231 and the sample and hold transistor 270 is set to $\alpha 2$. When the signal charges generated by the photoelectric conversion element 201 during an exposure period is set to Qph, the signal charges held in the sample and hold capacitor 231 after the exposure period ends are $A \times \alpha 1 \times \alpha 2 \times Qph$.

The signals based on the signal charges transferred to the charge-holding unit 230 from the photoelectric conversion element 201 are sampled and held by the sample and hold transistor 270 and are stored in the sample and hold capacitor 231. Therefore, a time until the signal charges are stored in the sample and hold capacitor 231 after the signal charges are transferred to the charge-holding unit 230 is short, and thus noise generated in the charge-holding unit 230 can be ignored. When noise generated during a period in which the sample and hold capacitor 231 holds the signal charges is assumed to be Qn similar to the above, S/N is $A \times \alpha 1 \times \alpha 2 \times Qph/Qn$.

On the other hand, S/N of a case in which the signal charges held in the charge-holding unit are read from the pixels via the amplifier transistor (e.g., in the case of the solid-state imaging device constituted by one substrate) is Qph/Qn. Therefore, S/N in the embodiment is $A \times \alpha 1 \times \alpha 2$ times this S/N. A capacitance value of the sample and hold capacitor 231 is set such that $A \times \alpha 1 \times \alpha 2$ is greater than 1 (e.g., the capacitance value of the sample and hold capacitor 231 is set to be sufficiently greater than a capacitance value of the charge-holding unit 230) so that deterioration of signal quality can be reduced.

Figure 6:
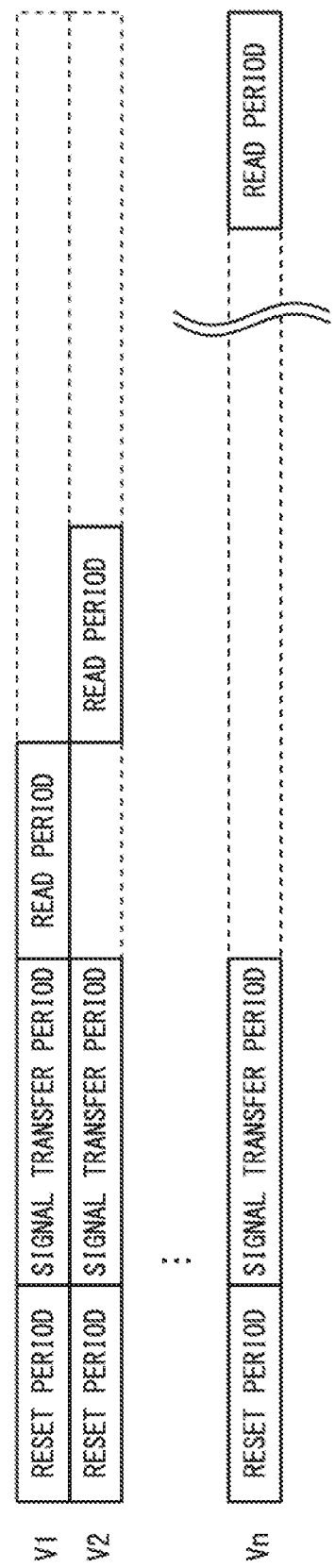
FIG. 6 is a timing chart illustrating operations of the pixels included in the solid-state imaging device according to the first embodiment of the present invention.

In the embodiment, timings of operations of pixel cells having the same vertical position are the same, but timings of operations of pixel cells having different vertical positions differ. FIG. 6 schematically illustrates timings of operations of pixel cells having different vertical positions (V1, V2, . . . , and Vn). Vertical positions of FIG. 6 indicate vertical positions in an arrangement of the pixel cells, and horizontal positions of FIG. 6 indicate time positions.

A reset period corresponds to the period T1 of FIG. 5, a signal transfer period corresponds to the period T2 of FIG. 5, and a read period corresponds to the period T3 of FIG. 5. As illustrated in FIG. 6, reset periods and signal transfer periods are the same in the pixel cells having different vertical positions. On the other hand, the read periods differ in the pixel cells having different vertical positions. In the above-mentioned operations, simultaneousness of the exposure can be realized in all pixel cells. In the above-mentioned operations, signal charges are simultaneously output from the plurality of photoelectric conversion elements 201 arranged in the same row and the plurality of photoelectric conversion elements 201 arranged in different rows.

In general, in photographing moving images, the exposure is performed through the rolling shutter operation in which timings of the exposure for every row differ. Distortion of a fast-moving subject becomes significant in the rolling shutter operation. In the embodiment, in photographing moving images, the global shutter operation is performed so that timings of the exposure are the same in all pixels from which signals are read. For this reason, distortion of a subject in a moving image can be reduced.

Figure 7:
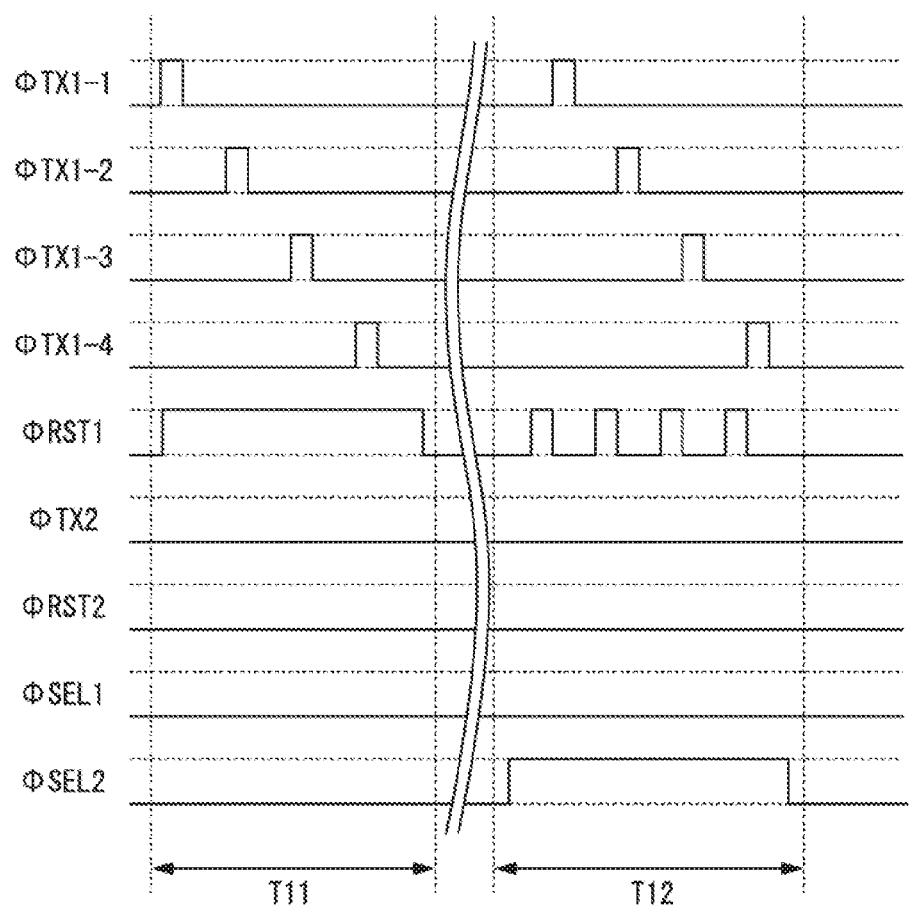
FIG. 7 is a timing chart illustrating operations of the pixels included in the solid-state imaging device according to the first embodiment of the present invention.

FIG. 7 illustrates operations of the pixels 100 in the second mode corresponding to photographing still images. Control signals supplied to the pixels 100 in every row from the vertical scanning circuit 300 are illustrated in FIG. 7. Vertical positions of FIG. 7 indicate voltages of the control signals, and horizontal positions of FIG. 7 indicate time positions. Hereinafter, the operations will be described in units of pixel cells constituted by the four pixels shown in FIG. 4.

[Operation of Period T11]

As the reset pulse $\Phi$RST1 changes from an "L" level to an "H" level, the first reset transistor 220 is turned on. Simultaneously, as the transfer pulse $\Phi$TX1-1 changes from an "L" level to an "H" level, the transfer transistor 211 is turned on. Thus, the photoelectric conversion element 201 of the first pixel is reset.

Subsequently, as the transfer pulse $\Phi$TX1-1 changes from the "H" level to the "L" level, the transfer transistor 211 is turned off. Here, the reset of the photoelectric conversion element 201 of the first pixel ends, and the exposure of the first pixel (the storage of the signal charges) starts. The photoelectric conversion elements 202, 203, and 204 are sequentially reset and the exposures sequentially start similarly also in the second pixel, the third pixel, and the fourth pixel. Subsequently, as the reset pulse $\Phi$RST1 changes from the "H" level to the "L" level, the first reset transistor 220 is turned off.

[Operation of Period T12]

In a period T12, the signals based on the signal charges stored in the photoelectric conversion elements 201, 202, 203, and 204 are sequentially read for every row. First, as the selection pulse $\Phi$SEL2 changes from an "L" level to an "H" level, the second selection transistor 292 is turned on. Subsequently, as the reset pulse $\Phi$RST1 changes from the "L" level to the "H" level, the first reset transistor 220 is turned on. Thus, the charge-holding unit 230 is reset. At this time, the signals based on the potential of the one end of the charge-holding unit 230 after the charge-holding unit 230 is reset are output to the vertical signal lines 120 via the second selection transistor 292. Subsequently, as the reset pulse $\Phi$RST1 changes from the "H" level to the "L" level, the first reset transistor 220 is turned off.

Subsequently, as the transfer pulse $\Phi$TX1-1 changes from the "L" level to the "H" level, the transfer transistor 211 is turned on. Thus, the signal charges stored in the photoelectric conversion element 201 are transferred to the charge-holding unit 230 via the transfer transistor 211 and are stored in the charge-holding unit 230. Here, the exposure of the first pixel (the storage of the signal charges) ends. A period from an exposure start of the first pixel in a period T11 to an exposure end of the first pixel in the period T12 is an exposure period (a signal-storage period). At this time, the signals based on the potential of the one end of the charge-holding unit 230 after the signal charges are transferred from the photoelectric conversion element 201 are output to the vertical signal lines 120 via the second selection transistor 292. Subsequently, as the transfer pulse ΦTX1-1 changes from the "H" level to the "L" level, the transfer transistor 211 is turned off.

Likewise, the signals based on the potential of the one end of the charge-holding unit 230 after the charge-holding unit 230 is reset and the signals based on the potential of the one end of the charge-holding unit 230 after the signal charges are transferred from the photoelectric conversion elements 202, 203, and 204 are sequentially output to the vertical signal lines 120 via the second selection transistor 292 also in the second pixel, the third pixel, and the fourth pixel. Subsequently, as the selection pulse ΦSEL2 changes from the "H" level to the "L" level, the second selection transistor 292 is turned off.

The column-processing circuits 350 generate differential signals obtained by taking differences between signals based on the potential of the one end of the charge-holding unit 230 after the signal charges are transferred from the photoelectric conversion elements 201, 202, 203, and 204 and signals based on the potential of the one end of the charge-holding unit 230 after the charge-holding unit 230 is reset. The signals output from the column-processing circuits 350 are output to the output amplifier 410 through the horizontal scanning circuit 400. The output amplifier 410 processes the signals output from the horizontal scanning circuit 400 and output the processed signals as image signals. Here, the reading of the signals ends.

Figure 8:
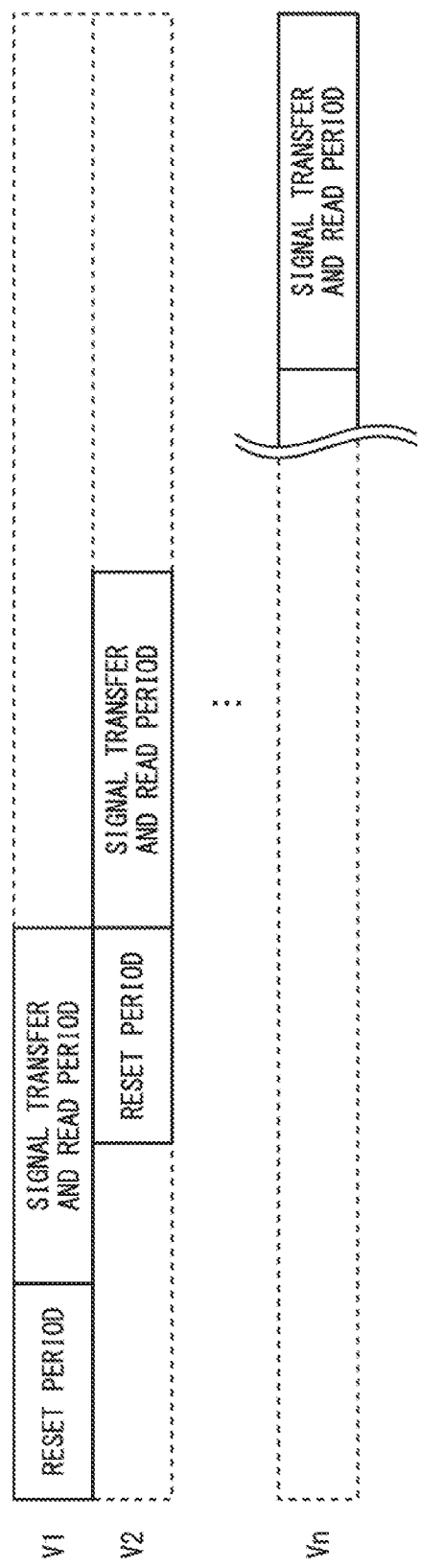
FIG. 8 is a timing chart illustrating operations of the pixels included in the solid-state imaging device according to the first embodiment of the present invention.

In the embodiment, timings of operations of pixel cells having the same vertical position are the same, but timings of operations of pixel cells having different vertical positions differ. FIG. 8 schematically illustrates timings of operations of pixel cells having different vertical positions (V1, V2, . . . , and Vn). Vertical positions of FIG. 8 indicate vertical positions in an arrangement of the pixel cells, and horizontal positions of FIG. 8 indicate time positions.

Reset periods correspond to the period T11 of FIG. 7, and signal transfer and read periods correspond to the period T12 of FIG. 7. As illustrated in FIG. 8, the signal transfer and read periods differ in the pixel cells having different vertical positions. In the above-mentioned operations, signal charges are simultaneously output from the plurality of photoelectric conversion elements 201, 202, 203, and 204 arranged in the same row, and signal charges are sequentially output from the plurality of photoelectric conversion elements 201, 202, 203, and 204 arranged in different rows. In the above-mentioned rolling shutter operation, exposure timings differ for every pixel cell having a different vertical position, but simultaneousness of the exposure can be realized if a mechanical shutter (not shown) is used.

According to the embodiment, the solid-state imaging device 3 in which the first substrate 20 and the second substrate 21 are electrically connected by the connection sections 250, includes the plurality of first photoelectric conversion elements (the photoelectric conversion elements 201) disposed on the first substrate 20 and configured to generate signal charges corresponding to incident light, the plurality of second photoelectric conversion elements (the photoelectric conversion elements 202, 203, and 204), which are different from the plurality of first photoelectric conversion elements, disposed on the first substrate 20 and configured to generate signal charges corresponding to incident light, a plurality of storage units (the sample and hold capacitors 231) disposed on the second substrate 21 and configured to store the signal charges output only from the plurality of first photoelectric conversion elements among the plurality of first photoelectric conversion elements and the plurality of second photoelectric conversion elements, and the control unit 500 disposed on the first substrate 20 or the second substrate 21 and configured to control the operations of the first mode of outputting the first signals based on the signal charges which are output only from the plurality of first photoelectric conversion elements among the plurality of first photoelectric conversion elements and the plurality of second photoelectric conversion elements and are stored in the plurality of storage units and the second mode of outputting the second signals based on the signal charges output from the plurality of first photoelectric conversion elements and the plurality of second photoelectric conversion elements without passing through the plurality of storage units.

According to the embodiment, the digital camera 10 including the above-mentioned solid-state imaging device 3 is constituted.

In the embodiment, the first signals based on the signal charges which are output from the plurality of photoelectric conversion elements 201 and are stored in the plurality of sample and hold capacitors 231 are output in the first mode corresponding to photographing moving images, and the second signals based on the signal charges output from the plurality of photoelectric conversion elements 201, 202, 203, and 204 are output without passing through the plurality of sample and hold capacitors 231 in the second mode corresponding to photographing still images. Since capacitors for storing the signal charges output from the plurality of photoelectric conversion elements 202, 203, and 204 need not be provided, restriction on the space in which the plurality of sample and hold capacitors 231 are disposed can be relaxed. Therefore, sizes of the sample and hold capacitors 231 can be increased, and thus preferable noise resistance can be acquired.

Also, since the exposure is performed through the global shutter operation in the first mode corresponding to photographing moving images, the distortion of the subject in the moving image can be reduced. The exposure is performed through the rolling shutter operation in the second mode corresponding to photographing still images, and the second signals based on the signal charges output from the photoelectric conversion elements 201, 202, 203, and 204 can be output.

Second Embodiment

Next, a second embodiment of the present invention will be described. A constitution of a solid-state imaging device according to the embodiment is the same as the constitution of the solid-state imaging device according to the first embodiment except for an array of color filters arranged on the pixel unit 200. In the second embodiment, the array of the color filters is a Bayer array in which unit arrays constituted by a red (R) color filter, two green (G) color filters, and a blue (B) color filter are regularly arranged.

Figure 9:
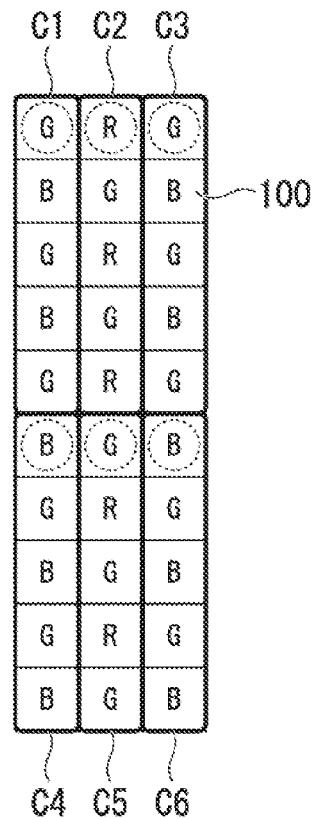
FIG. 9 is a reference diagram showing pixel cells in a solid-state imaging device according to a second embodiment of the present invention.

FIG. 9 shows pixel cells which share circuit elements. Squares represented by R, G, and B are the pixels 100 corresponding to the color filters of the colors. In FIG. 9, each of pixel cells C1, C2, C3, C4, C5, and C6 is constituted by five pixels 100 in five rows and one column. A constitution of each of the pixel cells is a constitution in which one photoelectric conversion element and one transfer transistor are added to the constitution shown in FIG. 4.

Operations of the pixels 100 are the same as the operations illustrated in FIGS. 5 to 8. In the first mode corresponding to photographing moving images, signal charges are output from the photoelectric conversion elements of the pixels 100 at relatively identical positions in the pixel cells.

For example, signal charges are output from the photoelectric conversion elements of the pixels 100 indicated by broken lines in FIG. 9, and are not output from the photoelectric conversion elements of the pixels 100 other than these pixels.

Signals corresponding to the colors of the Bayer array can be constituted by the signals output from the pixel cells. For example, a signal corresponding to green (G) is output from the pixel cell C1, a signal corresponding to red (R) is output from the pixel cell C2, a signal corresponding to blue (B) is output from the pixel cell C4, and a signal corresponding to green (G) is output from the pixel cell C5. Signals corresponding to a unit array of the Bayer array can be constituted by the signals output from the pixel cells C1, C2, C4, and C5.

The pixels 100 configured to output signals in the first mode corresponding to photographing moving images are not limited to the pixels 100 indicated by the broken lines in FIG. 9. The pixel cells are preferably constituted by the pixels 100 in odd rows and the signals are output from the pixels 100 at a relatively identical position in each of the pixel cells in order to acquire the signals corresponding to the colors of the Bayer array. Arrays of the pixels 100 in the pixel cells are preferably the same.

In the embodiment, a description has been given using the Bayer array, but the array of the color filters is not limited to the Bayer array. The array of the color filters may be any array in which arrays constituted by a plurality of color filters of colors are regularly arranged.

As described above, in the embodiment, the plurality of first photoelectric conversion elements configured to output the signal charges when moving images are photographed and when still images are photographed and the plurality of second photoelectric conversion elements configured to output the signal charges when moving images are photographed are arranged in a matrix form to correspond to the array constituted by the plurality of color filters of colors. Also, the first photoelectric conversion elements are arranged in rows at relatively identical positions in a plurality of groups (pixel cells) (the first photoelectric conversion elements are arranged in corresponding rows in the respective groups) including the first photoelectric conversion elements and the second photoelectric conversion elements.

Accordingly, the signals corresponding to the colors of the Bayer array can be acquired without complicating control.

Third Embodiment

Next, a third embodiment of the present invention will be described. A constitution of a solid-state imaging device according to the embodiment is the same as the constitution of the solid-state imaging device according to the first embodiment except for an array of color filters arranged on the pixel unit 200. In the third embodiment, the array of the color filters is the Bayer array.

When the pixels in which signal charges are read from the photoelectric conversion elements are simply thinned out as in the second embodiment, a planar sampling interval increases more than the interval in the first embodiment. Thus, moiré is likely to occur. In the third embodiment, the signal charges read from the plurality of photoelectric conversion elements corresponding to the same color are added so that occurrence of moiré can be reduced.

Figure 10:
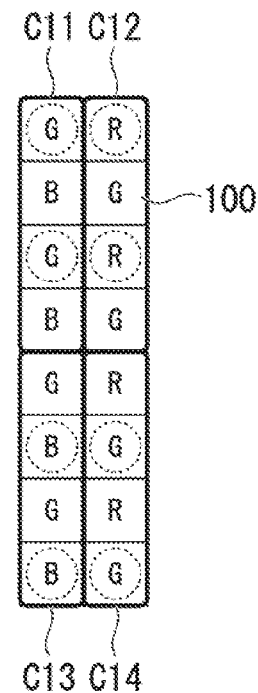
FIG. 10 is a reference diagram showing pixel cells in a solid-state imaging device according to a third embodiment of the present invention.

FIG. 10 shows pixel cells which share circuit elements. Squares indicated by R, G, and B are the pixels 100 corresponding to the color filters of the colors. In FIG. 10, one of pixel cells C11, C12, C13, and C14 is constituted by four pixels 100 in four rows and one column. A constitution of each of the pixel cells is the same as the constitution shown in FIG. 4.

In the embodiment, the plurality of first photoelectric conversion elements from which the signal charges are read both when moving images are photographed and when still images are photographed and the plurality of second photoelectric conversion elements from which the signal charges are read only when still images are photographed are arranged to correspond to the array constituted by the plurality of color filters of colors, and the plurality of sample and hold capacitors 231 (the storage units) store signal charges output from the plurality of first photoelectric conversion elements corresponding to the same color and added.

In a first example, the solid-state imaging device 3 further includes the plurality of charge-holding units 230 (addition units) disposed on the first substrate 20 or the second substrate 21 and configured to add the signal charges output from the plurality of first photoelectric conversion elements corresponding to the same color. In addition, the plurality of sample and hold capacitors 231 (the storage units) store the signal charges added by the plurality of charge-holding units 230.

In a second example, the plurality of sample and hold capacitors 231 (the storage units) add and store the signal charges output from the plurality of first photoelectric conversion elements corresponding to the same color.

In the first mode corresponding to photographing moving images, for example, signal charges are output as will be described below. Signal charges are output from the photoelectric conversion elements 201 and 203 of the pixels 100 corresponding to green (G) in the pixel cell C11. Signal charges are output from the photoelectric conversion elements 201 and 203 of the pixels 100 corresponding to red (R) in the pixel cell C12. Signal charges are output from the photoelectric conversion element 202 and 204 of the pixels 100 corresponding to blue (B) in the pixel cell C13. Signal charges are output from the photoelectric conversion elements 202 and 204 of the pixels 100 corresponding to green (G) in the pixel cell C14.

Figure 11:
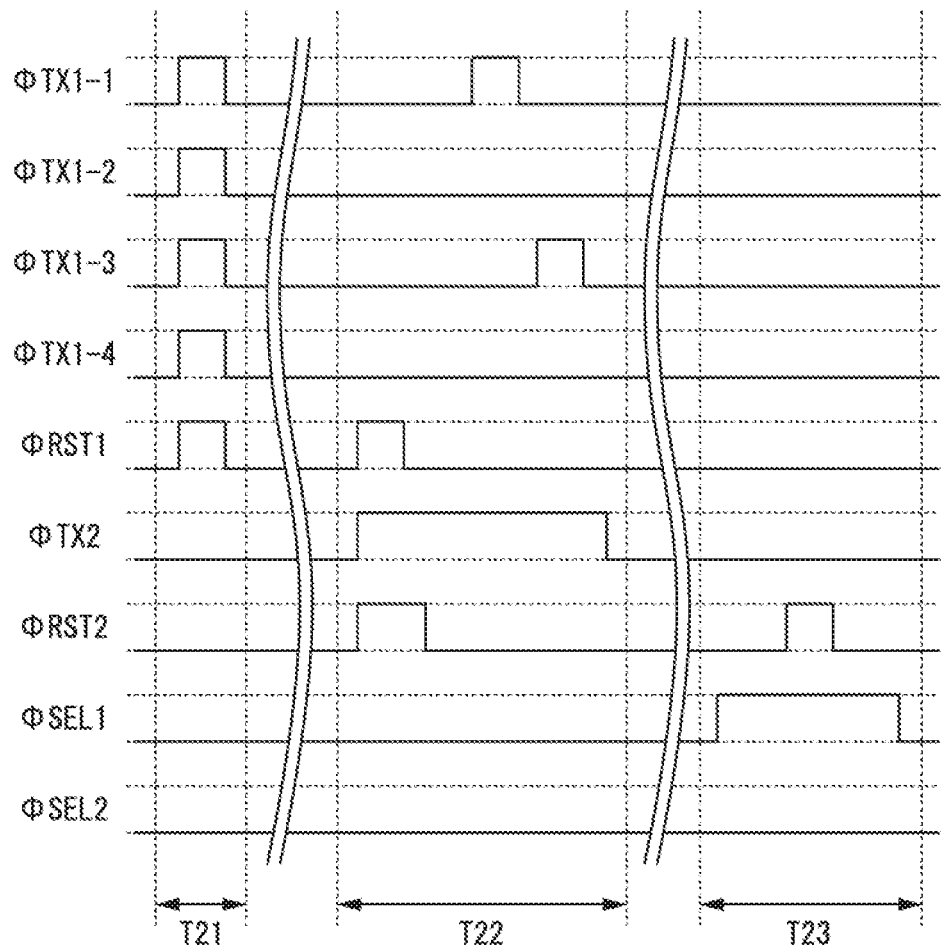
FIG. 11 is a timing chart illustrating operations of pixels included in the solid-state imaging device according to the third embodiment of the present invention.

Next, the operations of the pixels 100 will be described. FIG. 11 illustrates the operations of the pixels 100 in the first mode corresponding to photographing moving images (the operations in the first example). Control signals supplied to the pixels 100 in every row from the vertical scanning circuit 300 are illustrated in FIG. 11. Vertical positions of FIG. 11 indicate voltages of the control signals, and horizontal positions of FIG. 11 indicate time positions. Hereinafter, the operations will be described in units of pixel cells constituted by the four pixels shown in FIG. 4.

[Operation of Period T21]

As the reset pulse ΦRST1 changes from an "L" level to an "H" level, the first reset transistor 220 is turned on. Simultaneously, as the transfer pulses ΦTX1-1, ΦTX1-2, ΦTX1-3, and ΦTX1-4 change from an "L" level to an "H" level, the transfer transistors 211, 212, 213, and 214 are turned on. Thus, the photoelectric conversion elements 201, 202, 203, and 204 of the four pixels 100 are reset.

Subsequently, as the reset pulse ΦRST1 and the transfer pulses ΦTX1-1, ΦTX1-2, ΦTX1-3, and ΦTX1-4 change from the "H" level to the "L" level, the first reset transistor 220 and the transfer transistors 211, 212, 213, and 214 are turned off. Here, the reset of the photoelectric conversion elements 201, 202, 203, and 204 of the four pixels 100 ends, and the exposure of the four pixels 100 (the storage of the signal charges) starts.

[Operation of Period T22]

As the reset pulse ΦRST2 changes from an "L" level to an "H" level, the second reset transistor 221 is turned on. Thus, the sample and hold capacitor 231 is reset. Simultaneously, as the sample and hold pulse ΦTX2 changes from an "L" level to an "H" level, the sample and hold transistor 270 is turned on. Thus, the potential of the other end of the clamp capacitor 260 is reset to the power supply voltage VDD, and the sample and hold transistor 270 starts to sample and hold the potential of the other end of the clamp capacitor 260.

Simultaneously, as the reset pulse ΦRST1 changes from the "L" level to the "H" level, the first reset transistor 220 is turned on. Thus, the charge-holding unit 230 is reset. Subsequently, as the reset pulse ΦRST1 changes from the "H" level to the "L" level, the first reset transistor 220 is turned off. Here, the reset of the charge-holding unit 230 ends.

Subsequently, as the reset pulse ΦRST2 changes from the "H" level to the "L" level, the second reset transistor 221 is turned off. Here, the reset of the sample and hold capacitor 231 ends. At this time, the clamp capacitor 260 clamps the amplified signals output from the first amplifier transistor 240 (the amplified signals after the charge-holding unit 230 is reset).

Subsequently, as the transfer pulse ΦTX1-1 changes from the "L" level to the "H" level, the transfer transistor 211 is turned on. Thus, the signal charges stored in the photoelectric conversion element 201 are transferred to the charge-holding unit 230 via the transfer transistor 211 and are stored in the charge-holding unit 230. As a result, the signal charges output from the photoelectric conversion element 201 are stored in the charge-holding unit 230. Here, the exposure of the first pixel (the storage of the signal charges) ends. A period from an exposure start of the first pixel in a period T21 to an exposure end of the first pixel in a period T22 is an exposure period (a signal-storage period). Subsequently, as the transfer pulse ΦTX1-1 changes from the "H" level to the "L" level, the transfer transistor 211 is turned off. At this time, the clamp capacitor 260 clamps the amplified signals output from the first amplifier transistor 240 (the amplified signals after the signal charges from the photoelectric conversion element 201 are stored in the charge-holding unit 230).

Subsequently, as the transfer pulse ΦTX1-3 changes from an "L" level to an "H" level, the transfer transistor 213 is turned on. Thus, the signal charges stored in the photoelectric conversion element 203 are transferred to the charge-holding unit 230 via the transfer transistor 213 and are stored in the charge-holding unit 230. Here, the exposure of the third pixel (the storage of the signal charges) ends. A period from an exposure start of the third pixel in the period T21 to an exposure end of the third pixel in the period T22 is an exposure period (a signal-storage period). Lengths of the exposure period of the first pixel and the exposure period of the third pixel differ, but a difference between the lengths thereof is much smaller than the total length of the exposure period. Subsequently, as the transfer pulse ΦTX1-3 changes from the "H" level to the "L" level, the transfer transistor 213 is turned off. At this time, the clamp capacitor 260 clamps the amplified signals output from the first amplifier transistor 240 (the amplified signals after the signal charges from the photoelectric conversion elements 201 and 203 are stored in the charge-holding unit 230). Therefore, signal charges corresponding to the signal charges obtained by adding the signal charges output from the photoelectric conversion element 201 and the signal charges output from the photoelectric conversion element 203 are stored in the sample and hold capacitor 231.

Subsequently as the sample and hold pulse ΦTX2 changes from the "H" level to the "L" level, the sample and hold transistor 270 is turned off. Thus, the sample and hold transistor 270 finishes sampling and holding the potential of the other end of the clamp capacitor 260.

[Operation of Period T23]

In a period 123, the signals based on the signal charges stored in the sample and hold capacitor 231 are sequentially read for every row. As the selection pulse ΦSEL1 changes from an "L" level to an "H" level, the first selection transistor 291 is turned on. Thus, signals based on the signal charges obtained by adding the signal charges output from the photoelectric conversion elements 201 and 203 are output to the vertical signal lines 120 via the first selection transistor 291.

Subsequently, as the reset pulse ΦRST2 changes from the "L" level to the "H" level, the second reset transistor 221 is turned on. Thus, the sample and hold capacitor 231 is reset, and signals based on the potential of the one end of the sample and hold capacitor 231 at the time of resetting are output to the vertical signal lines 120 via the first selection transistor 291.

Subsequently as the reset pulse ΦRST2 changes from the "H" level to the "L" level, the second reset transistor 221 is turned off. Subsequently, as the selection pulse ΦSEL1 changes from the "H" level to the "L" level, the first selection transistor 291 is turned off.

The column-processing circuits 350 generate differential signals obtained by taking differences between signals based on the signal charges obtained by adding the signal charges output from the photoelectric conversion elements 201 and 203 and signals based on the potential of the one end of the sample and hold capacitor 231 when the sample and hold capacitor 231 is reset. The column-processing circuits 350 may average the signals based on the signal charges obtained by adding the signal charges output from the photoelectric conversion elements 201 and 203 and then generate differential signals. The signals output from the column-processing circuits 350 are output to the output amplifier 410 through the horizontal scanning circuit 400. The output amplifier 410 processes the signals output from the horizontal scanning circuit 400 and outputs the processed signals as image signals. Here, the reading of the signals ends.

In the operations illustrated in FIG. 11, signal charges are sequentially output from the plurality of photoelectric conversion elements included in the same pixel cell. Also, signal charges are simultaneously output from the plurality of photoelectric conversion elements included in the plurality of pixel cells in different rows and disposed in a relatively identical row in the pixel cells.

The operations illustrated in FIG. 11 correspond to the operations of the pixel cells C11 and C12 in FIG. 10. The operations of the pixel cells C13 and C14 in FIG. 10 are the same as the operations illustrated in FIG. 11 except that the operations of outputting the signal charges from the photoelectric conversion elements 201 and 203 are changed to operations of outputting signal charges from the photoelectric conversion elements 202 and 204.

Figure 12:
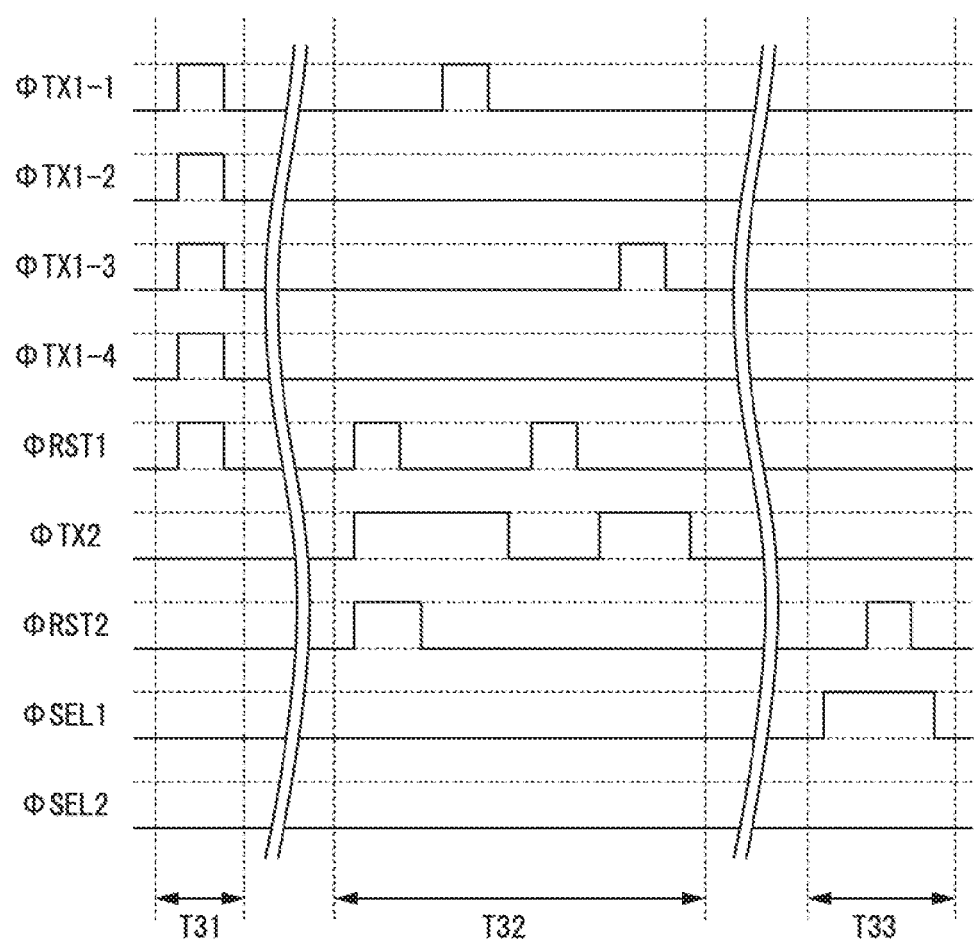
FIG. 12 is a timing chart illustrating operations of the pixels included in the solid-state imaging device according to the third embodiment of the present invention.

FIG. 12 illustrates other operations of the pixels 100 in the first mode corresponding to photographing moving images (the operations in the second example). Control signals supplied to the pixels 100 in every row from the vertical scanning circuit 300 are illustrated in FIG. 12. Vertical positions of FIG. 12 indicate voltages of the control signals, and horizontal positions of FIG. 12 indicate time positions. Hereinafter, the operations will be described in units of pixel cells constituted by the four pixels shown in FIG. 4.

[Operation of Period T31]

Since operations in a period T31 are the same as the operations in the period T21 of FIG. 11, a description thereof is omitted.

[Operation of Period T32]

As the reset pulse ΦRST2 changes from an "L" level to an "H" level, the second reset transistor 221 is turned on. Thus, the sample and hold capacitor 231 is reset. Simultaneously, as the sample and hold pulse ΦTX2 changes from an "L" level to an "H" level, the sample and hold transistor 270 is turned on. Thus, the potential of the other end of the clamp capacitor 260 is reset to the power supply voltage VDD, and the sample and hold transistor 270 starts to sample and hold the potential of the other end of the clamp capacitor 260.

Simultaneously, as the reset pulse ΦRST1 changes from an "L" level to an "H" level, the first reset transistor 220 is turned on. Thus, the charge-holding unit 230 is reset. Subsequently, as the reset pulse ΦRST1 changes from the "H" to the "L" level, the first reset transistor 220 is turned off. Here, the reset of the charge-holding unit 230 ends.

Subsequently, as the reset pulse ΦRST2 changes from the "H" level to the "L" level, the second reset transistor 221 is turned off. Here, the reset of the sample and hold capacitor 231 ends. At this time, the clamp capacitor 260 clamps the amplified signals output from the first amplifier transistor 240 (the amplified signals after the charge-holding unit 230 is reset).

Subsequently as the transfer pulse ΦTX1-1 changes from an "L" level to an "H" level, the transfer transistor 211 is turned on. Thus, the signal charges stored in the photoelectric conversion element 201 are transferred to the charge-holding unit 230 via the transfer transistor 211 and are stored in the charge-holding unit 230. Here, the exposure of the first pixel (the storage of the signal charges) ends. A period from an exposure start of the first pixel in the period T31 to an exposure end of the first pixel in a period T32 is an exposure period (a signal-storage period). Subsequently, as the transfer pulse ΦTX1-1 changes from the "H" level to the "L" level, the transfer transistor 211 is turned off. At this time, the clamp capacitor 260 clamps the amplified signals output from the first amplifier transistor 240 (the amplified signals after the signal charges from the photoelectric conversion element 201 are stored in the charge-holding unit 230).

Subsequently, as the sample and hold pulse ΦTX2 changes from the "H" level to the "L" level, the sample and hold transistor 270 is turned off. Thus, the sample and hold transistor 270 finishes sampling and holding the potential of the other end of the clamp capacitor 260.

Subsequently as the reset pulse ΦRST1 changes from the "L" level to the "H" level, the first reset transistor 220 is turned on. Thus, the charge-holding unit 230 is reset. Subsequently, as the reset pulse ΦRST1 changes from the "H" level to the "L" level, the first reset transistor 220 is turned off. Here, the reset of the charge-holding unit 230 ends.

Subsequently, as the sample and hold pulse ΦTX2 changes from the "L" level to the "H" level, the sample and hold transistor 270 is turned on. Thus, the potential of the other end of the clamp capacitor 260 is reset to the power supply voltage VDD, and the sample and hold transistor 270 starts to sample and hold the potential of the other end of the clamp capacitor 260.

Subsequently, as the transfer pulse ΦTX1-3 changes from an "L" level to an "H" level, the transfer transistor 213 is turned on. Thus, the signal charges stored in the photoelectric conversion element 203 are transferred to the charge-holding unit 230 via the transfer transistor 213 and are stored in the charge-holding unit 230. Here, the exposure of the third pixel (the storage of the signal charges) ends. A period from an exposure start of the third pixel in the period T31 to an exposure end of the third pixel in the period T32 is an exposure period (a signal-storage period). Lengths of the exposure period of the first pixel and the exposure period of the third pixel differ, but a difference between the lengths thereof is much smaller than the total length of the exposure period. Subsequently, as the transfer pulse ΦTX1-3 changes from the "H" level to the "L" level, the transfer transistor 213 is turned off. At this time, the clamp capacitor 260 clamps the amplified signals output from the first amplifier transistor 240 (the amplified signals after the signal charges from the photoelectric conversion element 203 are stored in the charge-holding unit 230). Therefore, at this time, signal charges corresponding to the signal charges obtained by adding the signal charges output from the photoelectric conversion element 201 and the signal charges output from the photoelectric conversion element 203 are stored in the sample and hold capacitor 231.

Subsequently, as the sample and hold pulse ΦTX2 changes from the "H" level to the "L" level, the sample and hold transistor 270 is turned off. Thus, the sample and hold transistor 270 finishes sampling and holding the potential of the other end of the clamp capacitor 260.

[Operation of Period T33]

Since operations in a period T33 are the same as the operations in the period T23 of FIG. 11, a description thereof is omitted.

In the operations illustrated in FIG. 12, signal charges are sequentially output from the plurality of photoelectric conversion elements included in the same pixel cell. Also, signal charges are simultaneously output from the plurality of photoelectric conversion elements included in the plurality of pixel cells in different rows and disposed in a relatively identical row in the pixel cells.

The operations illustrated in FIG. 12 correspond to the operations of the pixel cells C11 and C12 in FIG. 10. The operations of the pixel cells C13 and C14 in FIG. 10 are the same as the operations illustrated in FIG. 12 except that the operations of outputting the signal charges from the photoelectric conversion elements 201 and 203 are changed to operations of outputting signal charges from the photoelectric conversion elements 202 and 204.

Since the operations of the pixels 100 in the second mode corresponding to photographing still images are the same as the operations illustrated in FIG. 7, a description thereof is omitted.

In the embodiment, a description has been given using the Bayer array, but the array of the color filters is not limited to the Bayer array. The array of the color filters may be any array in which arrays constituted by a plurality of color filters of colors are regularly arranged.

In the embodiment, since the signal charges output and added from the plurality of photoelectric conversion elements corresponding to the same color are stored in the sample and hold capacitor 231, occurrence of moiré can be reduced. When capacitance of the charge-holding unit 230 is sufficient to add the signal charges, the operations illustrated in FIG. 11 are possible. When the capacitance of the charge-holding unit 230 is not sufficient to add the signal charges, the operations illustrated in FIG. 12 are preferable.

Fourth Embodiment

Next, a fourth embodiment of the present invention will be described. A constitution of a solid-state imaging device according to the embodiment is the same as the constitution of the solid-state imaging device according to the first embodiment except for an array of color filters arranged on the pixel unit 200. In the fourth embodiment, the array of the color filters is the Bayer array.

Figure 13:
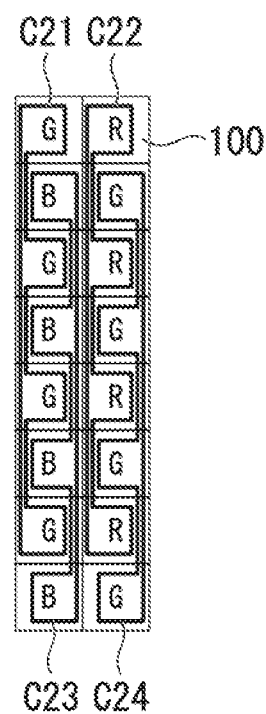
FIG. 13 is a reference diagram showing pixel cells in a solid-state imaging device according to a fourth embodiment of the present invention.

FIG. 13 shows pixel cells which share circuit elements. Squares indicated by R, G, and B are the pixels 100 corresponding to the color filters of the colors. In FIG. 13, each one of pixel cells C21, C22, C23, and C24 is constituted by four pixels 100 in four rows and one column. In the embodiment, one pixel cell is constituted by the plurality of pixels 100 corresponding to the same color. The pixels 100 in one pixel cell are not adjacent to each other. A constitution of each of the pixel cells is the same as the constitution shown in FIG. 4.

In the embodiment, the signal charges read from the plurality of photoelectric conversion elements corresponding to the same color are added in order to reduce occurrence of moiré. Also, in the embodiment, the signals charges are read from the photoelectric conversion elements of all of the pixels constituting the pixel cells.

For this reason, the solid-state imaging device 3 according to the embodiment is a solid-state imaging device in which the first substrate 20 and the second substrate 21 are electrically connected by the connection sections 250, and includes the plurality of photoelectric conversion elements (the photoelectric conversion elements 201, 202, 203, and 204) disposed to correspond to an array constituted by a plurality of color filters of colors on the first substrate 20 and configured to generate signal charges corresponding to incident light, the plurality of sample and hold capacitors 231 (storage units) disposed on the second substrate 21 and configured to store signal charges output and added from the plurality of photoelectric conversion elements, and the control unit 500 disposed on the first substrate 20 or the second substrate 21 and configured to control the operations of the first mode of outputting the first signals based on the signal charges which are output from the plurality of photoelectric conversion elements and are stored in the plurality of sample and hold capacitor 231 and the second mode of outputting the second signals based on the signal charges output from the plurality of photoelectric conversion elements without passing through the plurality of sample and hold capacitors 231.

In the first example, the solid-state imaging device 3 further includes the plurality of charge-holding units 230 (addition units) disposed on the first substrate 20 or the second substrate 21 and configured to add the signal charges output from the plurality of photoelectric conversion elements corresponding to the same color, and the plurality of sample and hold capacitors 231 (the storage units) store the signal charges added by the plurality of charge-holding units 230.

In the second example, the plurality of sample and hold capacitors 231 (the storage units) add and store the signal charges output from the plurality of photoelectric conversion elements corresponding to the same color.

Figure 14:
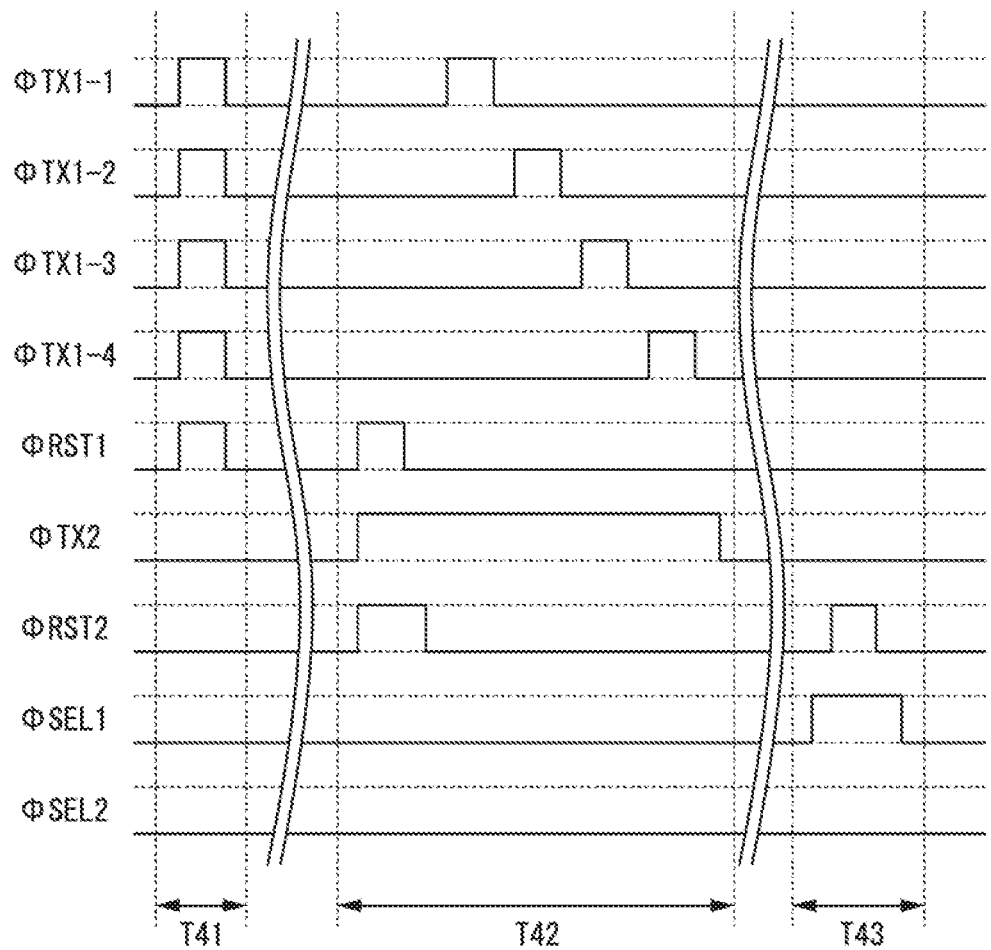
FIG. 14 is a timing chart illustrating operations of pixels included in the solid-state imaging device according to the fourth embodiment of the present invention.

Next, the operations of the pixels 100 will be described. FIG. 14 illustrates the operations of the pixels 100 in the first mode corresponding to photographing moving images (the operations in the first example). Control signals supplied to the pixels 100 in every row from the vertical scanning circuit 300 are illustrated in FIG. 14. Vertical positions of FIG. 14 indicate voltages of the control signals, and horizontal positions of FIG. 14 indicate time positions. Hereinafter, the operation will be described in units of pixel cells constituted by the four pixels shown in FIG. 4.

[Operation of Period T41]

As the reset pulse ΦRST1 changes from an "L" level to an "H" level, the first reset transistor 220 is turned on. Simultaneously, as the transfer pulses ΦTX1-1, ΦTX1-2, ΦTX1-3, and ΦTX1-4 change from an "L" level to an "H" level, the transfer transistors 211, 212, 213, and 214 are turned on. Thus, the photoelectric conversion elements 201, 202, 203, and 204 of the four pixels 100 are reset.

Subsequently, as the reset pulse ΦRST1 and the transfer pulses ΦTX1-1, ΦTX1-2, ΦTX1-3, and ΦTX1-4 change from the "H" level to the "L" level, the first reset transistor 220 and the transfer transistors 211, 212, 213, and 214 are turned off. Here, the reset of the photoelectric conversion elements 201, 202, 203, and 204 of the four pixels 100 ends, and the exposure of the four pixels 100 (the storage of the signal charges) starts.

[Operation of Period T42]

As the reset pulse ΦRST2 changes from an "L" level to an "H" level, the second reset transistor 221 is turned on. Thus, the sample and hold capacitor 231 is reset. Simultaneously, as the sample and hold pulse ΦTX2 changes from an "L" level to an "H" level, the sample and hold transistor 270 is turned on. Thus, the potential of the other end of the clamp capacitor 260 is reset to the power supply voltage VDD, and the sample and hold transistor 270 starts to sample and hold the potential of the other end of the clamp capacitor 260.

Simultaneously, as the reset pulse ΦRST1 changes from an "L" level to an "H" level, the first reset transistor 220 is turned on. Thus, the charge-holding unit 230 is reset. Subsequently, as the reset pulse ΦRST1 changes from the "H" level to the "L" level, the first reset transistor 220 is turned off. Here, the reset of the charge-holding unit 230 ends.

Subsequently, as the reset pulse ΦRST2 changes from the "H" level to the "L" level, the second reset transistor 221 is turned off. Here, the reset of the sample and hold capacitor 231 ends. At this time, the clamp capacitor 260 clamps the amplified signals output from the first amplifier transistor 240 (the amplified signals after the charge-holding unit 230 is reset).

Subsequently, as the transfer pulse ΦTX1-1 changes from an "L" level to an "H" level, the transfer transistor 211 is turned on. Thus, the signal charges stored in the photoelectric conversion element 201 are transferred to the charge-holding unit 230 via the transfer transistor 211 and are stored in the charge-holding unit 230. Here, the exposure of the first pixel (the storage of the signal charges) ends. A period from an exposure start of the first pixel in a period T41 to an exposure end of the first pixel in a period T42 is an exposure period (a signal-storage period). Subsequently, as the transfer pulse ΦTX1-1 changes from the "H" level to the "L" level, the transfer transistor 211 is turned off. At this time, the clamp capacitor 260 clamps the amplified signals output from the first amplifier transistor 240 (the amplified signals after the signal charges from the photoelectric conversion element 201 are stored in the charge-holding unit 230).

Likewise, the signal charges stored in the photoelectric conversion elements 202, 203, and 204 are sequentially transferred to the charge-holding unit 230 via the transfer transistors 212, 213, and 214 and are stored in the charge-holding unit 230 also in the second pixel, the third pixel, and the fourth pixel. As a result, the signal charges obtained by adding the signal charges output from the photoelectric conversion elements 201, 202, 203, and 204 are stored in the charge-holding unit 230. Lengths of the exposure periods of the pixels differ, but differences between the lengths thereof are much smaller than the total length of the exposure period. The clamp capacitor 260 clamps the amplified signals output from the first amplifier transistor 240 (the amplified signals after the signal charges from the photoelectric conversion elements 201, 202, 203, and 204 are stored in the charge-holding unit 230) at a point in time at which the signal charges output from the photoelectric conversion element 204 are stored in the charge-holding unit 230. Therefore, signal charges corresponding to the signal charges obtained by adding the signal charges output from the photoelectric conversion elements 201, 202, 203, and 204 are stored in the sample and hold capacitor 231.

Subsequently, as the sample and hold pulse ΦTX2 changes from the "H" level to the "L" level, the sample and hold transistor 270 is turned off. Thus, the sample and hold transistor 270 finishes sampling and holding the potential of the other end of the clamp capacitor 260.

[Operation of Period T43]

In a period T43, signals based on the signal charges stored in the sample and hold capacitor 231 are sequentially read for every row. As the selection pulse ΦSEL1 changes from an "L" level to an "H" level, the first selection transistor 291 is turned on. Thus, signals based on the signal charges obtained by adding the signal charges output from the photoelectric conversion elements 201, 202, 203, and 204 are output to the vertical signal lines 120 via the first selection transistor 291.

Subsequently, as the reset pulse ΦRST2 changes from an "L" level to an "H" level, the second reset transistor 221 is turned on. Thus, the sample and hold capacitor 231 is reset, and signals based on the potential of the one end of the sample and hold capacitor 231 at the time of resetting are output to the vertical signal lines 120 via the first selection transistor 291.

Subsequently, as the reset pulse ΦRST2 changes from the "H" level to the "L" level, the second reset transistor 221 is turned off. Subsequently, as the selection pulse ΦSEL1 changes from the "H" level to the "L" level, the first selection transistor 291 is turned off.

The column-processing circuits 350 generate differential signals obtained by taking differences between signals based on the signal charges obtained by adding the signal charges output from the photoelectric conversion elements 201, 202, 203, and 204 and signals based on the potential of the one end of the sample and hold capacitor 231 when the sample and hold capacitor 231 is reset. The column-processing circuits 350 may average the signals based on the signal charges obtained by adding the signal charges output from the photoelectric conversion elements 201, 202, 203, and 204 and then generate differential signals. The signals output from the column-processing circuits 350 are output to the output amplifier 410 through the horizontal scanning circuit 400. The output amplifier 410 processes the signals output from the horizontal scanning circuit 400 and the processed signals as image signals. Here, the reading of the signals ends.

In the operations illustrated in FIG. 14, signal charges are sequentially output from the plurality of photoelectric conversion elements included in the same pixel cell. Also, signal charges are simultaneously output from the plurality of photoelectric conversion elements included in the plurality of pixel cells in different rows and disposed in a relatively identical row in the pixel cells.

FIG. 15 illustrates other operations of the pixels 100 in the first mode corresponding to photographing moving images (the operations in the second example). Control signals supplied to the pixels 100 in every row from the vertical scanning circuit 300 are illustrated in FIG. 15. Vertical positions of FIG. 15 indicate voltages of the control signals, and horizontal positions of FIG. 15 indicate time positions. Hereinafter, the operations will be described in units of pixel cells constituted by the four pixels shown in FIG. 4.

[Operation of Period T51]

Since operations in a period T51 are the same as the operations in the period T41 of FIG. 14, a description thereof is omitted.

[Operation of period T52]

As the reset pulse ΦRST2 changes from an "L" level to an "H" level, the second reset transistor 221 is turned on. Thus, the sample and hold capacitor 231 is reset. Simultaneously, as the sample and hold pulse ΦTX2 changes from an "L" level to an "H" level, the sample and hold transistor 270 is turned on. Thus, the potential of the other end of the clamp capacitor 260 is reset to the power supply voltage VDD, and the sample and hold transistor 270 starts to sample and hold the potential of the other end of the clamp capacitor 260.

Simultaneously, as the reset pulse ΦRST1 changes from an "L" level to an "H" level, the first reset transistor 220 is turned on. Thus, the charge-holding unit 230 is reset. Subsequently, as the reset pulse ΦRST1 changes from the "H" to the "L" level, the first reset transistor 220 is turned off. Here, the reset of the charge-holding unit 230 ends.

Subsequently, as the reset pulse ΦRST2 changes from the "H" level to the "L" level, the second reset transistor 221 is turned off. Here, the reset of the sample and hold capacitor 231 ends. At this time, the clamp capacitor 260 clamps the amplified signals output from the first amplifier transistor 240 (the amplified signals after the charge-holding unit 230 is reset).

Subsequently, as the transfer pulse ΦTX1-1 changes from an "L" level to an "H" level, the transfer transistor 211 is turned on. Thus, the signal charges stored in the photoelectric conversion element 201 are transferred to the charge-holding unit 230 via the transfer transistor 211 and are stored in the charge-holding unit 230. Here, the exposure of the first pixel (the storage of the signal charges) ends. A period from an exposure start of the first pixel in the period T51 to an exposure end of the first pixel in a period T52 is an exposure period (a signal-storage period). Subsequently, as the transfer pulse ΦTX1-1 changes from the "H" level to the "L" level, the transfer transistor 211 is turned off. At this time, the clamp capacitor 260 clamps the amplified signals output from the first amplifier transistor 240 (the amplified signals after the signal charges from the photoelectric conversion element 201 are stored in the charge-holding unit 230).

Simultaneously, as the sample and hold pulse ΦTX2 changes from the "H" level to the "L" level, the sample and hold transistor 270 is turned off. Thus, the sample and hold transistor 270 finishes sampling and holding the potential of the other end of the clamp capacitor 260.

Subsequently, as the reset pulse ΦRST1 changes from the "L" level to the "H" level, the first reset transistor 220 is turned on. Thus, the charge-holding unit 230 is reset. Subsequently, as the reset pulse ΦRST1 changes from the "H" level to the "L" level, the first reset transistor 220 is turned off. Here, the reset of the charge-holding unit 230 ends.

Subsequently, as the sample and hold pulse ΦTX2 changes from the "L" level to the "H" level, the sample and hold transistor 270 is turned on. Thus, the potential of the other end of the clamp capacitor 260 is reset to the power supply voltage VDD, and the sample and hold transistor 270 starts to sample and hold the potential of the other end of the clamp capacitor 260.

Simultaneously, as the transfer pulse ΦTX1-2 changes from an "L" level to an "H" level, the transfer transistor 212 is turned on. Thus, the signal charges stored in the photoelectric conversion element 202 are transferred to the charge-holding unit 230 via the transfer transistor 212 and are stored in the charge-holding unit 230. Here, the exposure of the second pixel (the storage of the signal charges) ends. A period from an exposure start of the second pixel in the period T51 to an exposure end of the second pixel in the period T52 is an exposure period (a signal-storage period). Subsequently, as the transfer pulse ΦTX1-2 changes from the "H" level to the "L" level, the transfer transistor 212 is turned off. At this time, the clamp capacitor 260 clamps the amplified signals output from the first amplifier transistor 240 (the amplified signals after the signal charges from the photoelectric conversion element 202 are stored in the charge-holding unit 230). Therefore, at this time, signal charges corresponding to the signal charges obtained by adding the signal charges output from the photoelectric conversion element 201 and the signal charges output from the photoelectric conversion element 202 are stored in the sample and hold capacitor 231.

Subsequently as the sample and hold pulse ΦTX2 changes from the "H" level to the "L" level, the sample and hold transistor 270 is turned off. Thus, the sample and hold transistor 270 finishes sampling and holding the potential of the other end of the clamp capacitor 260.

Likewise, the signal charges stored in the photoelectric conversion elements 203 and 204 are sequentially transferred to the charge-holding unit 230 via the transfer transistors 213 and 214 and are stored in the charge-holding unit 230 also in the third pixel and the fourth pixel. Lengths of the exposure periods of the pixels differ, but a difference between the lengths thereof is much smaller than the total length of the exposure period. Signal charges corresponding to the signal charges obtained by adding the signal charges output from the photoelectric conversion elements 201, 202, 203, and 204 are stored in the sample and hold capacitor 231 at a point in time at which the signal charges output from the photoelectric conversion element 204 are stored in the charge-holding unit 230.

[Operation of Period T53]

Since operations in a period T53 are the same as the operations in the period T43 of FIG. 14, a description thereof is omitted.

In the operations illustrated in FIG. 15, signal charges are sequentially output from the plurality of photoelectric conversion elements included in the same pixel cell. Also, signal charges are simultaneously output from the plurality of photoelectric conversion elements included in the plurality of pixel cells in different rows and disposed in a relatively identical row in the pixel cells.

Since the operations of the pixels 100 in the second mode corresponding to photographing still images are the same as the operations illustrated in FIG. 7, a description thereof is omitted.

In the embodiment, a description has been given using the Bayer array, but the array of the color filters is not limited to the Bayer array. The array of the color filters may be any array in which arrays constituted by a plurality of color filters of colors are regularly arranged.

In the embodiment, since the signal charges output and added from the plurality of photoelectric conversion elements corresponding to the same color are stored in the sample and hold capacitor 231, occurrence of moiré can be reduced. When capacitance of the charge-holding unit 230 is sufficient to add the signal charges, the operations illustrated in FIG. 14 are possible. When the capacitance of the charge-holding unit 230 is not sufficient to add the signal charges, the operations illustrated in FIG. 15 are preferable.

Although embodiments of the present invention have been described in detail above with reference to the drawings, the specific constitution is not limited to the embodiments. In addition, changes in design, etc. are also included without departing from the scope and spirit of the present invention. The present invention is not limited by the above description, and is only limited by the appended claims.

What is claimed is:

1. A solid-state imaging device comprising:
a first substrate;
a second substrate disposed at a position facing the first substrate;
a plurality of first photoelectric conversion elements disposed on the first substrate and configured to generate signal charges corresponding to incident light;
a plurality of second photoelectric conversion elements different from the plurality of first photoelectric conversion elements, disposed on the first substrate, and configured to generate signal charges corresponding to incident light;
a plurality of connection sections disposed between the first substrate and the second substrate, each of the plurality of connection sections being connected to one corresponding first photoelectric conversion element among the plurality of first photoelectric conversion elements and one corresponding second photoelectric conversion element among the plurality of second photoelectric conversion elements;
a plurality of storage units disposed on the second substrate and configured to store signal charges output only from the plurality of first photoelectric conversion elements among the plurality of first photoelectric conversion elements and the plurality of second photoelectric conversion elements, each of the plurality of storage units being connected to one corresponding connection section among the plurality of connection sections; and
a control unit disposed on the first substrate or the second substrate and including a plurality of selection switches each of which is connected to one corresponding connection section among the plurality of connection sections, the control unit being configured to control operations of (i) a first mode of outputting first signals based on the signal charges output only from the plurality of first photoelectric conversion elements among the plurality of first photoelectric conversion elements and the plurality of second photoelectric conversion elements and stored in the plurality of storage units, and (ii) a second mode of outputting second signals based on the signal charges output from the plurality of first photoelectric conversion elements and the plurality of second photoelectric conversion elements without allowing the second signals to pass through the plurality of storage units.

2. The solid-state imaging device according to claim 1, wherein the plurality of first photoelectric conversion elements and the plurality of second photoelectric conversion elements are arranged in a matrix form, and
in the first mode, the control unit performs control of storing signal charges which are simultaneously output from the plurality of first photoelectric conversion elements disposed in different rows in the plurality of storage units and sequentially outputting the first signals based on the signal charges stored in the plurality of storage units.

3. The solid-state imaging device according to claim 1, wherein the plurality of first photoelectric conversion elements and the plurality of second photoelectric conversion elements are arranged in a matrix form, and
in the second mode, the control unit performs control of sequentially outputting the second signals based on signal charges which are sequentially output from the plurality of first photoelectric conversion elements and the plurality of second photoelectric conversion elements which are arranged in different rows without allowing the second signals to pass through the plurality of storage units.

4. The solid-state imaging device according to claim 1, wherein the plurality of first photoelectric conversion elements and the plurality of second photoelectric conversion elements are arranged in a matrix form to correspond to an array constituted by a plurality of color filters of colors, and
the first photoelectric conversion elements are arranged in rows at relatively identical positions in a plurality of groups including the first photoelectric conversion elements and the second photoelectric conversion elements.

5. The solid-state imaging device according to claim 1, wherein the plurality of first photoelectric conversion elements and the plurality of second photoelectric conversion elements are arranged to correspond to an array constituted by a plurality of color filters of colors, and
the plurality of storage units store signal charges output from the plurality of first photoelectric conversion elements corresponding to the same color and added.

6. The solid-state imaging device according to claim 5, further comprising:
a plurality of addition units disposed on the first substrate or the second substrate and configured to add signal charges output from the plurality of first photoelectric conversion elements corresponding to the same color,
wherein the plurality of storage units store signal charges added by the plurality of addition units.

7. The solid-state imaging device according to claim 5, wherein the plurality of storage units add and store signal charges output from the plurality of first photoelectric conversion elements corresponding to the same color.

8. The solid-state imaging device according to claim 1, further comprising:
a plurality of first output units disposed on the second substrate, connected to output signal lines, and configured to output the first signals to the output signal lines in the first mode; and
a plurality of second output units disposed on the second substrate, connected to the output signal lines, and configured to output the second signals to the output signal lines in the second mode.

9. The solid-state imaging device according to claim 1, further comprising:
a plurality of clamp capacitors disposed on the first substrate or the second substrate and configured to store signal charges output from the plurality of first photoelectric conversion elements; and
a plurality of sample and hold units disposed on the first substrate or the second substrate and configured to acquire signals based on signal charges stored in the plurality of clamp capacitors and to store signal charges based on the acquired signals in the plurality of storage units.

10. A solid-state imaging device comprising:
a first substrate;
a second substrate disposed at a position facing the first substrate;
a plurality of photoelectric conversion elements disposed on the first substrate to correspond to an array constituted by a plurality of color filters of colors and configured to generate signal charges corresponding to incident light;
a plurality of connection sections disposed between the first substrate and the second substrate and connected to the plurality of photoelectric conversion elements corresponding to the plurality of color filters;
a plurality of storage units disposed on the second substrate and configured to store signal charges output and added from the plurality of photoelectric conversion elements; and
a control unit disposed on the first substrate or the second substrate and including a plurality of selection switches each of which is connected to one corresponding connection section among the plurality of connection sections, the control unit being configured to control operations of (i) a first mode of outputting first signals based on signal charges output from the plurality of photoelectric conversion elements and stored in the plurality of storage units, and (ii) a second mode of outputting second signals based on signal charges output from the plurality of photoelectric conversion elements without allowing the second signals to pass through the plurality of storage units.

11. The solid-state imaging device according to claim 10, further comprising:
a plurality of addition units disposed on the first substrate or the second substrate and configured to add signal charges output from the plurality of photoelectric conversion elements corresponding to the same color,
wherein the plurality of storage units store signal charges added by the plurality of addition units.

12. The solid-state imaging device according to claim 11, wherein the plurality of storage units add and store signal charges output from the plurality of photoelectric conversion units corresponding to the same color.

13. An imaging apparatus comprising the solid-state imaging device according to claim 1.

14. An imaging apparatus comprising the solid-state imaging device according to claim 10.

* * * * *